United States Patent
Nakagawa et al.

(10) Patent No.: US 7,893,538 B2
(45) Date of Patent: Feb. 22, 2011

(54) ORGANIC SILICA FILM AND METHOD FOR FORMING SAME, COMPOSITION FOR FORMING INSULATING FILM OF SEMICONDUCTOR DEVICE AND METHOD FOR PRODUCING SAME, WIRING STRUCTURE AND SEMICONDUCTOR DEVICE

(75) Inventors: Hisashi Nakagawa, Tsukuba (JP); Tatsuya Yamanaka, Santa Clara, CA (US); Masahiro Akiyama, Auderghem (BE); Terukazu Kokubo, Tsukuba (JP); Youhei Nobe, Tsuchiura (JP)

(73) Assignee: JSR Corporation, Tokyo (JP)

( * ) Notice: Subject to any disclaimer, the term of this patent is extended or adjusted under 35 U.S.C. 154(b) by 262 days.

(21) Appl. No.: 12/278,224

(22) PCT Filed: Jan. 31, 2007

(86) PCT No.: PCT/JP2007/051631

§ 371 (c)(1),
(2), (4) Date: Nov. 25, 2008

(87) PCT Pub. No.: WO2007/088908

PCT Pub. Date: Aug. 9, 2007

(65) Prior Publication Data

US 2010/0007025 A1    Jan. 14, 2010

(30) Foreign Application Priority Data

Feb. 2, 2006 (JP) .............................. 2006-025572
Sep. 20, 2006 (JP) .............................. 2006-254389

(51) Int. Cl.
H01L 23/48 (2006.01)
(52) U.S. Cl. ................. 257/759; 257/40; 257/E27.117; 257/E21.24; 438/780; 438/781; 438/782; 438/787; 438/790
(58) Field of Classification Search .................. 257/40, 257/759, E21.117, E21.24; 438/622, 780, 438/781, 782, 787, 790; 528/33, 42
See application file for complete search history.

(56) References Cited

U.S. PATENT DOCUMENTS

| | | | |
|---|---|---|---|
| 6,204,201 B1 | 3/2001 | Ross | |
| 6,235,101 B1 | 5/2001 | Kurosawa et al. | |
| 6,383,913 B1 | 5/2002 | Tsai et al. | |
| 6,413,647 B1 | 7/2002 | Hayashi et al. | |
| 6,495,264 B2 | 12/2002 | Hayashi et al. | |
| 7,291,567 B2 | 11/2007 | Tsuchiya et al. | |
| 7,399,715 B2 | 7/2008 | Tsuchiya et al. | |
| 7,470,636 B2 * | 12/2008 | Ko et al. ............. | 438/790 |
| 2004/0058090 A1 | 3/2004 | Waldfried et al. | |
| 2005/0096415 A1 | 5/2005 | Akiyama et al. | |
| 2006/0006541 A1 * | 1/2006 | Tsuchiya et al. ............. | 257/759 |
| 2006/0024980 A1 | 2/2006 | Tsuchiya et al. | |
| 2006/0210812 A1 | 9/2006 | Shiota | |
| 2006/0275614 A1 | 12/2006 | Shiota | |
| 2007/0015892 A1 | 1/2007 | Nakagawa et al. | |
| 2007/0020467 A1 | 1/2007 | Nakagawa et al. | |
| 2007/0021580 A1 | 1/2007 | Nakagawa et al. | |
| 2007/0027287 A1 | 2/2007 | Akiyama et al. | |
| 2007/0031687 A1 | 2/2007 | Akiyama et al. | |
| 2008/0038527 A1 | 2/2008 | Akiyama et al. | |
| 2008/0268264 A1 | 10/2008 | Akiyama et al. | |
| 2009/0281237 A1 | 11/2009 | Nakagawa et al. | |
| 2010/0168327 A1 | 7/2010 | Akiyama et al. | |
| 2010/0174103 A1 | 7/2010 | Nobe et al. | |

FOREIGN PATENT DOCUMENTS

| | | |
|---|---|---|
| EP | 1 122 770 | 8/2001 |
| JP | 63 248710 | 10/1988 |
| JP | 63 289939 | 11/1988 |
| JP | 1 194980 | 8/1989 |
| JP | 3 30427 | 2/1991 |
| JP | 8 29932 | 3/1996 |
| JP | 2000 109695 | 4/2000 |
| JP | 2000 290590 | 10/2000 |
| JP | 2000 309752 | 11/2000 |
| JP | 2000 313612 | 11/2000 |
| JP | 2001 110802 | 4/2001 |
| JP | 2004 59737 | 2/2004 |
| JP | 2004 149714 | 5/2004 |
| JP | 2005 200571 | 7/2005 |
| WO | 03 025994 | 3/2003 |
| WO | 2005 068538 | 7/2005 |

OTHER PUBLICATIONS

U.S. Appl. No. 12/749,735, filed Mar. 30, 2010, Nobe, et al.
Mickler, Ed et al., "A Charge Damage Study using an Electron Beam $Low_k$ Treatment", Proceedings of the International Interconnect Technology Conference, pp. 190-192, (2004).
Miyajima, H. et al., "The Application of Simultaneous eBeam Cure Method for 65 nm node Cu/Low-k Technology with Hybrid (PAE/MSX) Structure", Proceedings of the International Interconnect Technology Conference, pp. 222-224, (2004).
Hedrick, James L. et al., "Templating Nanoporosity in Thin-Film Dielectric Insulators", Advanced Materials, vol. 10, No. 13, pp. 1049-1053, (1998).

* cited by examiner

*Primary Examiner*—Jasmine J Clark
(74) *Attorney, Agent, or Firm*—Oblon, Spivak, McClelland, Maier & Neustadt, L.L.P.

(57) ABSTRACT

An insulating-film-forming composition for a semiconductor device comprising an organic silica sol with a carbon atom content of 11 to 17 atom % and an organic solvent is disclosed. The organic silica sol comprises a hydrolysis-condensation product P1 and a hydrolysis-condensation product P2. The hydrolysis-condensation product P1 is obtained by hydrolyzing and condensing (A) a silane monomer comprising a hydrolyzable group and (B) a polycarbosilane comprising a hydrolyzable group in the presence of (C) a basic catalyst, and the hydrolysis-condensation product P2 is obtained by hydrolyzing and condensing (D) a silane monomer comprising a hydrolyzable group.

23 Claims, No Drawings

US 7,893,538 B2

ORGANIC SILICA FILM AND METHOD FOR FORMING SAME, COMPOSITION FOR FORMING INSULATING FILM OF SEMICONDUCTOR DEVICE AND METHOD FOR PRODUCING SAME, WIRING STRUCTURE AND SEMICONDUCTOR DEVICE

TECHNICAL FIELD

The present invention relates to an organic silica film and a method for forming the same, an insulating-film-forming composition for a semiconductor device and a method for producing the same, a wiring structure, and a semiconductor device.

BACKGROUND ART

Silica ($SiO_2$) films formed by a vacuum process such as a CVD method are abundantly used as an interlayer dielectric of semiconductor devices in large scale integrated circuits (LSI), and the like. In order to form a semiconductor interlayer dielectric with a more uniform film thickness, a coating-type insulating film, called an SOG (spin on glass), which contains an alkoxysilane hydrolyzate as a major component, has been used in recent years. Moreover, along with high integration of LSI, an interlayer dielectric with a low relative dielectric constant in which an organic silica sol such as MSQ (methylsilsesquioxane) is used as a major component has also been developed (U.S. Pat. Nos. 6,235,101, 6,413,647, and 6,495,264).

The organic silica sol can be cured by a dehydration condensation reaction of silanol groups contained in the sol by heating at 350 to 500° C., to produce an insulating film having a low relative dielectric constant, mechanical properties, and chemical resistance suitable for semiconductor devices. However, since this reaction of the organic silica sol is a solid phase reaction, the dehydration condensation proceeds only with difficulty due to diffusion restriction, requiring a long heating time of at least about 30 minutes, and usually one hour. A batch heating furnace which can heat many (usually 50 to 150) wafers at once for a long period of time is used for processing a spin-on interlayer dielectric with a low relative dielectric constant. However, the semiconductor device which mainly needs an interlayer dielectric with a low relative dielectric constant is in the logic device field, in which the device wiring manufacturing process is shifting to a sheet-feed process to produce wafers one by one in a short time. Since ASICs and custom ICs which are in the mainstream of the logic device are produced in high-mix low-volume production, a sheet-feed process is mainly used in order to promote freedom of the manufacturing process.

As a method for curing a composition for forming an interlayer dielectric with a low relative dielectric constant, which uses organic silica sol as a major component in a short time, and improving the strength, a method using electron beams has been proposed (U.S. Pat. No. 6,204,201 and European Patent No. 1,122,770). The method is characterized by positively decomposing and activating the organic groups in the organic silica film and introducing new crosslinking of Si—CHx-Si and the like, in addition to causing a silanol condensation reaction to occur by simultaneous heating and electron beam irradiation. Use of electron beams makes it possible to produce films with only minimal moisture absorption and having excellent mechanical properties, usually within five minutes, and to process wafers by a sheet-feed process. On the other hand, there is a concern that electron beam irradiation may accumulate electric charges which damage the transistor structure in LSIs. Thus, there are pros and cons in curing the composition for forming an interlayer dielectric with a low relative dielectric constant using electron beams (E. Mickler et al. Proceedings of the International Interconnect Technology Conference, p 190, 2004, Miyajima, et al. Proceedings of the International Interconnect Technology Conference, p 222, 2004).

Besides the electron beams, ultraviolet radiation may be another candidate to be used in a method of curing a composition for forming an interlayer dielectric with a low relative dielectric constant which uses organic silica sol as a major component in a short time. The point of discussion is once changed to technologies other than the interlayer dielectric for LSIs. A photo sol-gel technology of gelling silica sol in which the condensation reaction of silanol and alkoxide is accelerated by adding a photoacid generator or a photobase generator, which generates an acid or a base by ultraviolet irradiation to silica sol and alkoxysilane, is known and applied to optical waveguide formation and the like (JP-A-2000-109695, etc.) A silica film produced by curing using such a photoacid generator or a photobase generator generally contains a large amount of silanol residue and is highly hygroscopic. As a result, the film has a high relative dielectric constant. The moisture absorption by silanol residue can be reduced by heating the gel obtained by ultraviolet irradiation at about 250 to 500° C. for a period longer than a specific period of time (usually 30 minutes or more). This method is no more than the above-mentioned method of curing the silica film by heating. In addition, in the composition containing such a photoacid generator or a photobase generator, the photoacid generator or photobase generator and the acids and bases produced therefrom act as charged carriers which cause problems such as impairing insulation and deteriorating wiring metals. Such a composition, therefore, cannot satisfy qualities of the insulation film of semiconductor devices for LSIs in which high insulation reliability is required.

Due to the excellent transparency to ultraviolet radiation, the siloxane compound has also been studied as a main skeleton of $F_2$ photoresist which uses ultraviolet radiation at a wavelength of 157 nm. Although siloxane is used as a backbone, the technology basically applies the principle of chemical amplification photoresist with which KrF and ArF light sources are also used. That is, ultraviolet radiation is used not for promoting the crosslinking reaction of the silica sol, but for causing the photoacid generator to generate an acid. The acid cleaves chemical bonds and produces a functional group such as a carboxylic acid which is readily dissolved in a basic developer. This technology does not promote the crosslinking reaction of the silica sol using ultraviolet radiation.

Since the surface of an organic silica film cured with heat, electron beams, or the like is hydrophobic, such a surface is treated with ultraviolet radiation with an objective of improving the hydrophobic properties (U.S. Pat. No. 6,383,913, JP-A-63-248710, JP-A-63-289939, JP-B-8-29932, JP-A-2001-110802, and etc.). According to these methods, the pole surface of an organic silica film is oxidized with ozone generated by irradiating the film with ultraviolet rays in the air, whereby the hydrophobic surface is reformed to the hydrophilic surface which is more reactive with silanol and the like. The reforming is mainly carried out in order to increase adhesiveness with a film which is formed on the upper layer.

As described above, technology of applying a polysiloxane resin solution or an organic silica sol solution to a substrate and applying ultraviolet radiation after forming a film has been widely studied. However, few technologies are reported involving the use of ultraviolet radiation for curing organic silica sol in order to form an interlayer dielectric of semiconductor devices for LSI. A few examples are disclosed in JP-A-3-30427, JP-A-1-194980, WO 03/025994, and US-A-2004/0058090.

JP-A-3-30427 discloses a technology of obtaining a silicon dioxide film at a low temperature by applying a solution of tetraalkoxysilane (for example, tetraethoxysilane (TEOS)) in collodion to a semiconductor substrate and applying ultraviolet radiation under a nitrogen atmosphere. This technology is characterized by fixing highly volatile TEOS by collodion and promoting decomposition of collodion and the dehydration-condensation of TEOS by ultraviolet radiation. JP-A-1-194980 discloses a technology in which an organosiloxane resin is applied to a substrate and subjected to ultraviolet radiation with a main wavelength of 254 nm with heating at 200° C. or less, the surface of the organosiloxane film is oxidized by ozone produced by application of ultraviolet radiation, and the organosiloxane film is heated at 400° C. or more, particularly about 900° C., to obtain a densified silicon dioxide film.

On the other hand, WO 03/025994 and US-A-2004/0058090 disclose a method of curing HSQ (hydrogenated silsesquioxane) or MSQ by ultraviolet radiation. In this method, active oxygen (for example, ozone) generated in the system by irradiating HSQ or HSQ/MSQ condensate in the presence of oxygen promotes oxidation of Si-H in the HSQ to form a silica film with many $SiO_2$ bonds. These documents outline that the technique is effective also for MSQ and the presence of oxygen is more effective for curing, and that formation of $SiO_2$ bonds by active oxygen is thought to be the main mechanism of the crosslinking reaction. Thus, it is difficult for the other curing methods to form $SiO_2$ bonds in such a short period of time. The use of ultraviolet radiation is one of the technical features of this method. However, due to the increased number of $SiO_2$ bonds, which results in a film with high modulus of elasticity and high hardness on the one hand, the silica film produced by this method has a problem of producing a film with high hydrophilicity which increases the moisture absorption and relative dielectric constant. Generally, a film with high hygroscopicity is easily damaged by RIE (reactive ion etching) at the time of processing the interlayer dielectric for semiconductor devices and has poor resistance to a wet cleaning liquid. This tendency is particularly remarkable in the case of an interlayer dielectric with a low relative dielectric constant of k=2.5 or less in which the insulation film itself has a porous structure. Therefore, (a) an organic silica sol composition curable in a short time, not containing ionic substances such as a photoacid generator, a photobase generator, and a photosensitizer, or a source of a charge carrier or a corrosive compound, (b) a method for curing an organic silica film which can be processed by a sheet-feed process without damaging the transistor structure, (c) an organic silica film having low hygroscopicity and high hydrophobicity, and (d) an organic silica film having mechanical properties resistive to formation of a copper damascene structure are desired for forming an interlayer dielectric with a low relative dielectric constant used in semiconductor devices for LSI.

The organic silica sol composition for forming an insulation film with a low relative dielectric constant for semiconductor devices is usually formulated so as to exhibit a high modulus of elasticity after heat curing, taking the yield when producing a dynamic stress such as CMP (chemical mechanical polishing), packaging, and the like into consideration (for example, U.S. Pat. No. 6,495,264). Specifically, an absolute crosslink density of the silica film can be increased by increasing the amount of tetra-functional silane compounds (hereinafter referred to from time to time as "Q component") in the organic silica to 40 mol % or more. The crosslink density is increased by increasing the amount of the Q component and a film with a high modulus of elasticity and hardness can be obtained. However, it is difficult to completely react the crosslinking part (silanol) possessed by the Q component. Use of too large an amount of the Q component increases silanol residue after heat curing, resulting in hydrophilic and high hygroscopic film. In order to compensate this weak point, a method of reducing the absolute amount of silanols in the sol by producing a sol with a high degree of condensation by carrying out the co-condensation reaction with an alkoxysilane having a hydrophobic group such as methyltrialkoxysilane usually in the presence of a basic catalyst (such as ammonia and tetraalkylhydroxyammonium) (U.S. Pat. No. 6,413,647), and a method of additionally processing the high condensation sol by a hydrophobic treatment (JP-A-2004-59737 and JP-A-2004-149714) have been proposed. The organic silica sol containing a large amount of such a Q component still does not necessarily exhibit sufficient RIE resistance and wet cleaning liquid resistance.

The inventors of the invention have previously proposed a method for producing a polymer by co-condensation of a polysiloxane derived from a silane monomer containing a hydrolyzable group and a polycarbosilane by reacting the hydrolyzable group-containing silane monomer in the presence of the polycarbosilane, and a method for producing a hybrid polymer film having a low relative dielectric constant and exhibiting no phase separation in the film by using a film-forming composition containing this polymer (WO 2005/068538). However, the hybrid polymer film may be inferior in modulus of elasticity and anti-crack properties in the film thickness beyond 1 micrometer to a silica film formed using a composition containing the Q component as a main raw material.

DISCLOSURE OF THE INVENTION

An object of the invention is to provide an insulating-film-forming composition for a semiconductor device which can form an insulation film possessing both mechanical properties and etching resistance (for example, RIE resistance during dry etching, chemical resistance during wet etching, etc.), a method for producing the composition, an organic silica film obtained by using the composition, and a method for forming the organic silica film.

Another object of the invention is to provide a composition capable of forming an insulation film with a low relative dielectric constant which is suitably used for producing a semiconductor device for LSI for which high integration and multilayering are desired, and requiring only a reduced heating time by irradiation with ultraviolet rays, a method for producing the composition, an organic silica film obtained by using the composition, and a method for forming the organic silica film.

A further object of the invention is to provide a wiring structure including the organic silica film obtained by the above method for forming an organic silica film and a semiconductor device including the wiring structure.

The insulating-film-forming composition for a semiconductor device according to one aspect of the invention comprises an organic silica sol with a carbon atom content of 11 to 17 atom % and an organic solvent. The organic silica sol comprises a hydrolysis-condensation product P1 and a hydrolysis-condensation product P2. The hydrolysis-condensation product P1 is obtained by hydrolyzing and condensing (A) a silane monomer comprising a hydrolyzable group and (B) a polycarbosilane comprising a hydrolyzable group in the presence of (C) a basic catalyst, and the hydrolysis-condensation product P2 is obtained by hydrolyzing and condensing (D) a silane monomer comprising a hydrolyzable group.

In the insulating-film-forming composition for a semiconductor device, the (A) silane monomer comprising a hydrolyzable group may be at least one silane compound selected from the group consisting of compounds of the following formulas (1) to (3), $$R_a Si(OR^1)_{4-a} \quad (1)$$

wherein R represents a hydrogen atom, a fluorine atom, or a monovalent organic group, $R^1$ represents a monovalent organic group, and a represents 1 or 2, $$Si(OR^2)_4 \quad (2)$$

wherein $R^2$ represents a monovalent organic group, and $$R^3{}_b(R^4O)_{3-b}Si-(R^7)_d-Si(OR^5)_{3-c}R^6{}_c \quad (3)$$

wherein $R^3$ to $R^6$ individually represent monovalent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1.

The proportion of the compound shown by the above formula (2) in the (A) silane monomer comprising a hydrolyzable group may be 40 mol % or less.

In the insulating-film-forming composition for a semiconductor device, the (A) silane monomer comprising a hydrolyzable group may be at least one compound selected from the group consisting of compounds of the above formula (1) and compounds of the above formula (3).

In the insulating-film-forming composition for a semiconductor device, the (A) silane monomer comprising a hydrolyzable group may include a compound of the compounds of the above formula (1). In this instance, at least one compound of the above formula (1) may be included, and the proportion of the compound having a=1 in the above formula (1) in the compounds shown by the above formula (1) may be 60 mass % or more.

In the above insulating-film-forming composition for a semiconductor device, the above hydrolysis-condensation product P1 may not substantially comprise a site in which one silicon atom is substituted with four oxygen atoms.

In the above insulating-film-forming composition for a semiconductor device, the organic silica sol may comprise the hydrolysis-condensation product P1 and the hydrolysis-condensation product P2 in a proportion satisfying the relationship of P1/(P1+P2)≧0.50 (mass ratio).

In the insulating-film-forming composition for a semiconductor device, the (B) polycarbosilane comprising a hydrolyzable group may have a structural unit shown by the following formula (4),

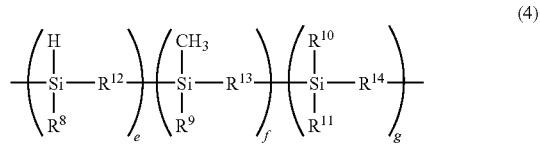

wherein $R^8$ represents a group selected from the group consisting of a hydrogen atom, a halogen atom, a hydroxyl group, an alkoxy group, an acyloxy group, a sulfone group, a methanesulfone group, a trifluoromethanesulfone group, an alkyl group, an aryl group, an allyl group, and a glycidyl group, $R^9$ represents a group selected from the group consisting of a halogen atom, a hydroxyl group, an alkoxy group, an acyloxy group, a sulfone group, a methanesulfone group, a trifluoromethanesulfone group, an alkyl group, an aryl group, an allyl group, and a glycidyl group, $R^{10}$ and $R^{11}$ individually represent a group selected from the group consisting of a halogen atom, a hydroxyl group, an alkoxy group, an acyloxy group, a sulfone group, a methanesulfone group, a trifluoromethanesulfone group, an alkyl group having 2 to 6 carbon atoms, an aryl group, an allyl group, and a glycidyl group, $R^{12}$ to $R^{14}$ individually represent a substituted or unsubstituted methylene group, an alkylene group, an alkenylene group, an alkynylene group, or an arylene group, and e, f, and g individually represent an integer from 0 to 10,000, provided that 5<e+f+g<10,000 is satisfied.

In the above insulating-film-forming composition for a semiconductor device, the (D) silane monomer comprising a hydrolyzable group may be at least one compound selected from the group consisting of the compound of the following formula (5), the compound of the following formula (6), the compound of the following formula (7), and the compound of the following formula (8), $$R^{15}Si(OR^{16})_3 \quad (5)$$

wherein $R^{15}$ and $R^{16}$ individually represent an alkyl group or an aryl group, $$Si(OR^{17})_4 \quad (6)$$

wherein $R^{17}$ represents an alkyl group or an aryl group, $$(R^{18})_2Si(OR^{19})_2 \quad (7)$$

wherein $R^{18}$ represents an alkyl group or an aryl group, and $R^{19}$ represents an alkyl group or an aryl group, and $$R^{21}{}_b(R^{22}O)_{3-b}Si-(R^{25})_d-Si(OR^{23})_{3-c}R^{24}{}_c \quad (8)$$

wherein $R^{21}$ to $R^{24}$ individually represent an alkyl group or an aryl group, b and c individually represent an integer from 0 to 2, $R^{25}$ represents an oxygen atom, a phenylene group, or a group $-(CH_2)_m-$ (wherein m represents an integer from 1 to 6), and d represents 0 or 1.

In this instance, the (D) silane monomer comprising a hydrolyzable group may comprise 10 to 60 mol % of the compound shown by the above formula (5) and 40 to 90 mol % of the compound shown by the above formula (6).

In the above insulating-film-forming composition for a semiconductor device, the weight average molecular weight of the hydrolysis-condensation product P2 may be larger than the weight average molecular weight of the hydrolysis-condensation product P1.

The above insulating-film-forming composition for a semiconductor device may not comprise a reaction accelerator responsive to ultraviolet radiation. In this instance, the reaction accelerator may be one of, or a combination of two or more of, a reaction initiator, an acid generator, a base generator, and a photosensitizer having a ultraviolet absorption function.

The method for producing an insulating-film-forming composition for a semiconductor device according to one aspect of the invention is a method of producing the above-mentioned insulating-film-forming composition for a semiconductor device. The method comprises forming a hydrolysis-condensation product P1 by hydrolyzing and condensing (A) a silane monomer comprising a hydrolyzable group and (B) a polycarbosilane comprising a hydrolyzable group in the presence of (C) a basic catalyst, and forming a hydrolysis-condensation product P2 by hydrolyzing and condensing (D) a silane monomer comprising a hydrolyzable group.

The method for producing an organic silica film of one aspect of the invention comprises applying the above insulating-film-forming composition for a semiconductor device to a substrate to form a coating and irradiating the coating with ultraviolet rays to cure the coating.

In the above method of forming an organic silica film, the ultraviolet radiation may have a wavelength of 250 nm or less.

In the above method of forming an organic silica film, the coating may be heated while applying the ultraviolet radiation.

In the above method of forming an organic silica film, the heating temperature may be 300 to 450° C.

In the above method of forming an organic silica film, the ultraviolet radiation may be applied in the absence of oxygen.

The organic silica film of one aspect of the invention is obtained by the above method of forming an organic silica film and has a relative dielectric constant of 1.5 to 3.5 and a film density of 0.7 to 1.3 $g/cm^3$.

A wiring structure of one aspect of the invention comprises the above organic silica film as an interlayer dielectric.

The semiconductor device of one aspect of the invention comprises the above wiring structure.

Due to inclusion of the hydrolysis-condensation product P1 and the hydrolysis-condensation product P2, the insulating-film-forming composition for a semiconductor device (hereinafter referred to from time to time as "film-forming composition") can produce an insulating film having both excellent mechanical properties (for example, modulus of elasticity and crack resistance) and excellent etching resistance (for example, dry etching (RIE) after film-forming and chemical resistance during wet etching) and having a low relative dielectric constant and low hygroscopicity by applying the film-forming composition to a substrate and curing the coating by heating or ultraviolet irradiation.

BEST MODE FOR CARRYING OUT THE INVENTION

The film-forming composition and the method for producing the same, the organic silica film and the method for forming the same, the wiring structure using the organic silica film, and the semiconductor device including the wiring structure according to one embodiment of the invention will be described below.

1. Film-forming-composition and Method of Producing the Same

The film-forming composition according to one embodiment of the invention comprises an organic silica sol and an organic solvent.

The method for producing a film-forming composition for a semiconductor device according to one embodiment of the invention comprises forming a hydrolysis-condensation product P1 by hydrolyzing and condensing (A) a silane monomer containing a hydrolyzable group and (B) a polycarbosilane containing a hydrolyzable group in the presence of (C) a basic catalyst, and forming a hydrolysis-condensation product P2 by hydrolyzing and condensing (D) a silane monomer containing a hydrolyzable group.

The details of each component of the film-forming composition for a semiconductor device according to one embodiment of the invention are described below.

1.1. Organic Silica Sol

In the film-forming composition for a semiconductor device according to one embodiment of the invention, the organic silica sol comprises the hydrolysis-condensation product P1 and the hydrolysis-condensation product P2. That is, due to inclusion of the hydrolysis-condensation product P1 and the hydrolysis-condensation product P2 in the film-forming composition for a semiconductor device according to one embodiment of the invention, a low dielectric constant insulating film exhibiting both mechanical characteristics and etching resistance can be obtained by using the film-forming composition for a semiconductor device.

The weight average molecular weight of the hydrolysis-condensation product P2 is preferably larger than the weight average molecular weight of the hydrolysis-condensation product P1. The weight average molecular weight of the hydrolysis-condensation product P2 being larger than the weight average molecular weight of the hydrolysis-condensation product P1 makes it possible for the insulating film formed from the insulating-film-forming composition of the invention to have more excellent mechanical characteristics (modulus of elasticity, crack resistance, etc.) than the films obtained from a composition containing only the hydrolysis-condensation product P1 or a composition containing only the hydrolysis-condensation product P2. The weight average molecular weight of the hydrolysis-condensation product P2 is preferably 1.2 to 18 times, more preferably 1.5 to 10 times, and more preferably 2.0 to 5.0 times of the weight average molecular weight of the hydrolysis-condensation product P1.

The mixing ratio of the hydrolysis-condensation product P1 and the hydrolysis-condensation product P1 preferably satisfies the relationship P1/(P1 +P2)>0.5. The mixing ratio of the hydrolysis-condensation product P1 and the hydrolysis-condensation product P2 satisfying the above relationship makes it possible for the insulating film to have as excellent etching resistance as the film formed from a composition containing only the hydrolysis-condensation product P1 and to have improved mechanical characteristics such as modulus of elasticity as excellent as the film made from a composition containing only the hydrolysis-condensation product P1. The mixing ratio of the hydrolysis-condensation product P1 and the hydrolysis-condensation product P2 more preferably satisfies the relationship P1/(P1+P2)≧0.6, and still more preferably the relationship P1/(P1+P2)≧0.7.

1.1.1 Hydrolysis-condensation Product P1

The hydrolysis-condensation product P1 can be obtained by hydrolysis and condensation of the (A) silane monomer containing a hydrolyzable group (hereinafter referred to from time to time as "component (A)") and the (B) polycarbosilane (hereinafter referred to from time to time as "component (B)") in the presence of the (C) basic catalyst.

The weight average molecular weight of the hydrolysis-condensation product P1 is preferably 5,000 to 100,000, and more preferably 10,000 to 50,000. If the weight average molecular weight of the hydrolysis-condensation product P1 is larger than this range, particles are easily produced and pores in the organic silica film become too large. On the other hand, if the weight average molecular weight of the hydrolysis-condensation product P1 is smaller than this range, problems easily occur in coatabilty and storage stability.

The component (A) may be at least one silane compound (A-1) selected from the group consisting of compounds of the following formulas (1) to (3),

$$R_a Si(OR^1)_{4-a} \quad (1)$$

wherein R represents a hydrogen atom, a fluorine atom, or a monovalent organic group, $R^1$ represents a monovalent organic group, and a represents an integer of 1 or 2, $$Si(OR^2)_4 \quad (2)$$

wherein $R^2$ represents a monovalent organic group, and

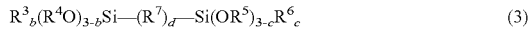
$$R^3{}_b(R^4O)_{3-b}Si\!-\!(R^7)_d\!-\!Si(OR^5)_{3-c}R^6{}_c \quad (3)$$

wherein $R^3$ to $R^6$ individually represent a monovalent organic group, b and c individually represent an integer from 0 to 2, $R^7$ represents an oxygen atom, a phenylene group, or a group —$(CH_2)_m$— (wherein m represents an integer from 1 to 6), and d represents 0 or 1.

The component (A) may also be at least one compound (A-2) selected from the group consisting of compounds of the above formula (1) and the compounds of the above formula (3).

When the component (A) is the compound (A-2), the hydrolysis-condensation product P1 preferably does not substantially have a site in which one silicon atom is substituted by four oxygen atoms. The statement "not substantially have a site in which one silicon atom is substituted by four oxygen atoms" can be confirmed by the absence of a peak in a range from −90 ppm to −120 ppm in the observation by $^{29}$Si NMR analysis. The peak is deemed not to be observed in a range from −90 ppm to −120 ppm by $^{29}$Si NMR analysis, if the total value of the integral of the peaks found in the range from −90 to −120 ppm is less than 0.01, when the total value of the integral of the peaks found in 50 to −80 ppm is presumed to be 1. The peaks in 50 to −80 ppm correspond to the component of the site in which one silicon atom is substituted by three or less oxygen atoms.

In the film-forming composition according to one embodiment of the invention, use of the hydrolysis-condensation product P1 substantially having no site in which one silicon atom is substituted by four oxygen atoms further improves chemical resistance, whereby durability in processing for a longer period of time, such as wet etching and dry etching, can be ensured.

In order for the hydrolysis-condensation product P1 to have substantially no site in which one silicon atom is substituted by four oxygen atoms, the component (A) is preferably the compound (A-2). That is, it is preferable not to use a monomer having a site in which one silicon atom is substituted by four oxygen atoms as the component (A), and to use a component (B) not having a site in which one silicon atom is substituted by four oxygen atoms.

The compound (B) may have a structural unit shown by the following formula (4), for example.

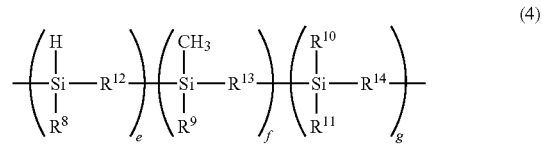

wherein $R^8$ represents a group selected from the group consisting of a hydrogen atom, a halogen atom, a hydroxyl group, an alkoxy group, an acyloxy group, a sulfone group, a methane sulfone group, a trifluoromethane sulfone group, an alkyl group, an aryl group, an allyl group, and a glycidyl group, $R^9$ represents a group selected from the group consisting of a halogen atom, a hydroxyl group, an alkoxy group, an acyloxy group, a sulfone group, a methane sulfone group, a trifluoromethane sulfone group, an alkyl group, an aryl group, an allyl group, and a glycidyl group, $R^{10}$ and $R^{11}$ individually represent a group selected from the group consisting of a halogen atom, a hydroxyl group, an alkoxy group, an acyloxy group, a sulfone group, a methane sulfone group, a trifluoromethane sulfone group, an alkyl group having 2 to 6 carbon atoms, an aryl group, an allyl group, and a glycidyl group, $R^{12}$ to $R^{14}$ individually represent a substituted or unsubstituted methylene group, alkylene group, alkenyl group, alkynyl group, or arylene group, and e, f, and g individually represent an integer from 0 to 10,000, provided that 5<e+f+g<10,000 is satisfied.

The component (A), the component (B), the mixing ratio of the components, and additives are described below in detail.

1.1.1-1. Component (A)

To form the component (A), the following compounds may be used as the compound shown by the above formula (1) (hereinafter referred to as "compound 1"), the compound shown by the above formula (2) (hereinafter referred to as "compound 2"), and the compound shown by the above formula (3) (hereinafter referred to as "compound 3").

(i) Compound 1

As examples of the monovalent organic group represented by $R^1$ and $R^2$ in the formula (1), an alkyl group, an alkenyl group, an aryl group, an allyl group, a glycidyl group, and the like can be given. Among these, an alkyl group and a phenyl group are preferable as the monovalent organic group represented by $R^1$ and $R^2$.

As examples of the alkyl group, a methyl group, an ethyl group, a propyl group, a butyl group, and the like can be given. The alkyl group preferably has 1 to 5 carbon atoms. These alkyl groups may be either linear or branched, in which a hydrogen atom may be replaced with a fluorine atom or the like. As examples of the aryl group, a phenyl group, a naphthyl group, a methylphenyl group, an ethylphenyl group, a chlorophenyl group, a bromophenyl group, a fluorophenyl group, and the like can be given. As examples of the alkenyl group, a vinyl group, a propenyl group, a 3-butenyl group, a 3-pentenyl group, a 3-hexenyl group, and the like can be given.

Specific examples of the compound 1 include methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltri-iso-propoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyliso-triethoxysilane, sec-butyltri-n-propoxysilane, sec-butyltri-iso-propoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltri-iso-propoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldi-phenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldi-phenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxy silane, di-sec-butyldi-phenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldi-phenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, and diphenyldiphenoxysilane. These compounds may be used individually or in combination of two or more.

The particularly preferable compounds for the compound 1 are methyltrimethoxysilane, methyltriethoxysilane, methyltri-n-propoxysilane, methyltri-iso-propoxysilane, ethyltrimethoxysilane, ethyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, and the like. These compounds may be used individually or in combination of two or more.

The film-forming composition according to one embodiment of the invention preferably includes the compound shown by the formula (1) as the component (A), and more preferably includes at least one compound shown by the formula (1), and the proportion of the compound in which a is 1 in the formula (1) among the compounds shown by the above formula (1) is 60 mass % or more.

(ii) Compound 2

As examples of the monovalent organic group represented by $R^2$ in the formula (2), the same groups given as examples of R and $R^1$ in the formula (1) can be given.

As specific examples of the compound 2, tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, and the like can be given. Of these, tetramethoxysilane and tetraethoxysilane are particularly preferable. These compounds may be used individually or in combination of two or more.

In the film-forming composition according to one embodiment of the invention, the component (A) includes the compound 2 in an amount of preferably 40 mol % or less, and more preferably 5 to 35 mol %, when the component (A) used for preparing the hydrolysis-condensation product P1 is the compound (A-1).

(iii) Compound 3

As examples of the $R^3$ to $R^6$ in the formula (3), the same groups given as examples of the $R^1$ and the $R^2$ in the formula (1) can be given.

Examples of the compound 3, wherein d=0 in the formula (3), include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenydisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like.

Of these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

Examples of the compound 3, wherein d=1 in the formula (3), include bis(trimethoxysilyl)methane, bis(triethoxysilyl)methane, bis(tri-n-propoxysilyl)methane, bis(tri-iso-propoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-iso-propoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-iso-propoxymethylsilyl)-1-(tri-iso-propoxysilyl)methane, 1-(di-n-butoxymethylsilyl)-1-(tri-n- butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-iso-propoxymethylsilyl)-2-(tri-iso-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(di-iso-propoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-iso-propoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-iso-propoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-iso-propoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-iso-propoxysilyl)benzene, 1,4-bis(tri-n-butoxysilyl)benzene, 1,4-bis(tri-sec-butoxysilyl)benzene, and 1,4-bis(tri-tert-butoxysilyl)benzene.

Of these, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

Those compounds as the compound 3 may be used either individually or in combination of two or more.

1.1.1-2. Component (B)

As mentioned above, the component (B) is a polycarbosilane having a hydrolyzable group. Specific examples of the hydrolyzable group include, but are not limited to, a halogen atom, a hydroxyl group, an alkoxy group, an acyloxy group, a sulfone group, a methanesulfone group, and a trifluoromethanesulfone group.

The component (B) may be, for example, a polycarbosilane compound having a structural unit shown by the formula (4) (hereinafter referred to as "compound 4").

As examples of the alkylene group represented by $R^{12}$ to $R^{14}$ in the formula (4), an ethylene group, a propylene group, a butylene group, a hexylene group, a decylene group, and the like can be given. The alkylene group preferably has 2 to 6 carbon atoms and may be linear, branched, or cyclic. The hydrogen atoms of the alkylene group may be replaced with fluorine atoms and the like.

As examples of the alkenyl group represented by $R^{12}$ to $R^{14}$ in the formula (4), an ethenylene group, a propenylene group, a 1-butenylene group, a 2-butenylene group, and the like can be given. The alkenyl group may be a dienylene group. The alkenyl group preferably has 1 to 4 carbon atoms. The hydrogen atoms of the alkenyl group may be replaced with fluorine atoms and the like. As examples of the alkynyl group represented by $R^{12}$ to $R^{14}$, an acetylene group, a propynylene group, and the like can be given. As examples of the arylene group represented by $R^{12}$ to $R^{14}$, a phenylene group, a naphthylene group, and the like can be given. The hydrogen atoms of the arylene group may be replaced with fluorine atoms and the like. $R^8$ to $R^{11}$ may be the same group or different groups.

In the formula (4), e, f, and g represent 0 to 10,000, provided that $5<e+f+g<10,000$. If $e+f+g<10$, storage stability of the film-forming composition may be inferior, and if $10,000<e+f+g$, layer separation occurs, which may lead to forming a nonuniform film. e, f and g are preferably $0<e<800$, $0<f<500$, $0<g<1000$, and more preferably $0<e<500$, $0<f<300$, $0<g<500$, and still more preferably $0<e<100$, $0<f<50$, $0<g<100$.

It is preferable that e, g, and g satisfy $5<e+f+g<1000$, more preferably $5<e+f+g<500$, still more preferably $5<e+f+g<250$, and most preferably $5<e+f+g<100$.

The compound 4 may be obtained by reacting at least one compound selected from chloromethyltrichlorosilane, bromomethyltrichlorosilane, chloromethylmethyldichlorosilane, chloromethylethyldichlorosilane, chloromethylvinyldichlorosilane, chloromethylphenyldichlorosilane, bromomethylmethyldichlorosilane, bromomethylvinyldichlorosilane, chloromethyldimethylchlorosilane, chloromethyldivinylchlorosilane, bromomethyldimethylchlorosilane, (1-chloroethyl)trichlorosilane, (1-chloropropyl)trichlorosilane, chloromethyltrimethoxysilane, bromomethyltrimethoxysilane, chloromethylmethyldimethoxysilane, chloromethylvinyldimethoxysilane, chloromethylphenyldimethoxysilane, bromomethylmethyldimethoxysilane, bromomethylvinyldimethoxysilane, bromomethylphenyldimethoxysilane, chloromethyldimethylmethoxysilane, chloromethyldivinylmethoxysilane, chloromethyldiphenylmethoxysilane, bromomethyldimethylmethoxysilane, bromomethyldiisopropylmethoxysilane, chloromethyltriethoxysilane, bromomethyltriethoxysilane, chloromethylmethyldiethoxysilane, chloromethylethyldiethoxysilane, chloromethylvinyldiethoxysilane, chloromethylphenyldiethoxysilane, bromomethylmethyldiethoxysilane, bromomethylvinyldiethoxysilane, bromomethylphenyldiethoxysilane, chloromethyldimethylethoxysilane, chloromethyldiethylethoxysilane, bromomethyldivinylethoxysilane, chloromethyltriisopropoxysilane, and bromomethyltriisopropoxysilane in the presence of at least one of an alkali metal and an alkaline earth metal, optionally followed by treatment with an alcohol, an organic acid, a reducing agent, or the like.

The weight average molecular weight of the component (B) is preferably 300 to 100,000, and more preferably 500 to 10,000. If the weight average molecular weight of the component (B) exceeds this range, particles are easily produced and pores in the organic silica film become too large.

1.1.1-3. Basic Catalyst (C)

Examples of the basic catalyst (C) include sodium hydroxide, potassium hydroxide, lithium hydroxide, cerium hydroxide, barium hydroxide, calcium hydroxide, pyridine, pyrrole, piperazine, pyrrolidine, piperidine, picoline, ammonia, methylamine, ethylamine, propylamine, butylamine, dimethylamine, diethylamine, dipropylamine, dibutylamine, trimethylamine, triethylamine, tripropylamine, tributylamine, monoethanolamine, diethanolamine, dimethylmonoethanolamine, monomethyldiethanolamine, triethanolamine, diazabicyclooctrane, diazabicyclononane, diazabicycloundecene, urea, tetramethylammonium hydroxide, tetraethylammonium hydroxide, tetrapropylammonium hydroxide, tetrabutylammonium hydroxide, benzyltrimethylammonium hydroxide, choline, and the like. Among these, ammonia, organic amines, and ammonium hydroxides are preferable and tetramethylammonium hydroxide, tetraethylammonium hydroxide, and tetrapropylammonium hydroxide are particularly preferable. These basic catalysts may be used individually or in combination of two or more.

The amount of the basic catalyst (C) is usually 0.00001 to 1 mol, and preferably 0.00005 to 0.5 mol for 1 mol of the total amount of the alkoxyl groups in the component (A) and the component (B). The use of the basic catalyst (C) in the above range reduces the possibility of polymer deposition and gelling during the reaction.

When the component (A) and the component (B) are hydrolyzed and condensed in the presence of the basic catalyst (C), it is desirable to add water in an amount of preferably 0.5 to 150 mol, and particularly preferably 0.5 to 130 mol, for 1 mol of the total amount of the component (A) and the component (B). Because a long time is required for hydrolysis and condensation reactions, an amount less than 0.5 mol of water is not preferable when productivity is considered. If the amount of water exceeds 150 mol, polymer deposition and gelling during the condensation reaction may occur.

Alcohols having a boiling point of 100° C. or less are preferably used together with water. Examples of the alcohols having a boiling point of 100° C. or less are methanol, ethanol, n-propanol, and isopropanol. The amount of the alcohols having a boiling point of 100° C. or less is usually 3 to 100 mol, and preferably 5 to 80 mol, for 1 mol of the total amount of the component (A) and the component (B).

Alcohols having a boiling point of 100° C. or less may be produced when the component (A) and the component (B) are hydrolyzed and/or condensed. It is desirable to remove such alcohols by distillation or the like so that the content is maintained at 20 wt % or less, and preferably at 5 wt % or less. A dehydrating agent such as methyl orthoformate, an additional metal complex, and a leveling agent may be added as additives.

It is preferable to adjust the pH to 7 or less after producing the hydrolysis-condensation product P1 by hydrolyzing and condensing the component (A) and the component (B) in the presence of the basic catalyst (C). Examples of the method of adjusting the pH are: 1) adding a pH adjuster, 2) removing the basic compounds from the composition by evaporation under a normal or reduced pressure, 3) removing the basic compounds from the composition by injecting gas such as nitrogen, argon, and the like, 4) removing the basic compounds from the composition using ion-exchange resins, 5) removing the basic compounds from the system by extraction or washing, or the like. These methods may be used in combination.

As examples of the pH adjuster, an inorganic acid and an organic acid can be given. As examples of the inorganic acid, hydrochloric acid, nitric acid, sulfuric acid, fluoric acid, phosphoric acid, boric acid, oxalic acid, and the like can be given. As examples of the organic acid, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, hydrolysate of glutaric acid, hydrolysate of maleic anhydride, hydrolysate of phthalic anhydride, and the like can be given. These compounds may be used individually or in combination of two or more.

The pH of the composition is adjusted to 7 or less, preferably 1 to 6, by the pH adjustor mentioned above. The storage stability of the film-forming composition is improved by adjusting the pH in the above range. The amount of the pH adjuster is selected appropriately to put the pH of the film-forming composition in the above range.

1.1.2. Hydrolysis-condensation Product P2

1.1.2-1. Raw Materials

The hydrolysis-condensation product P2 is obtained by hydrolyzing and condensing the (D) silane monomer containing a hydrolyzable group (hereinafter referred to from time to time as "Compound (D)").

The weight average molecular weight of the hydrolysis-condensation product P2 is preferably 10,000 to 500,000, and more preferably 20,000 to 300,000. If the weight average molecular weight of the hydrolysis-condensation product P2 is more than 500,000, particles are easily produced and pores in the organic silica film become too large. If the weight average molecular weight of the hydrolysis-condensation product P2 is less than 10,000, mechanical properties of the insulating film formed from the P1/P2-mixed film composition are not fully exhibited.

The component (D) may be at least one silane compound selected from the group consisting of a compound shown by the following formula (5) (hereinafter referred to from time to time as "compound 5"), a compound shown by the following formula (6) (hereinafter referred to from time to time as "compound 6"), a compound shown by the following formula (7) (hereinafter referred to from time to time as "compound 7"), and a compound shown by the following formula (8) (hereinafter referred to from time to time as "compound 8"),

$$R^{15}Si(OR^{16})_3 \tag{5}$$

wherein $R^{15}$ and $R^{16}$ individually represent an alkyl group or an aryl group,

$$Si(OR^{17})_4 \tag{6}$$

wherein $R^{17}$ represents an alkyl group or an aryl group,

$$(R^{18})_2Si(OR^{19})_2 \tag{7}$$

wherein $R^{18}$ represents an alkyl group or an aryl group, and $R^{19}$ represents an alkyl group or an aryl group, and

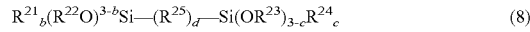

$$R^{21}{}_b(R^{22}O)^{3-b}Si\text{—}(R^{25})_d\text{—}Si(OR^{23})_{3-c}R^{24}{}_c \tag{8}$$

wherein $R^{21}$ to $R^{24}$ individually represent an alkyl group or an aryl group, b and c individually represent an integer from 0 to 2, $R^{25}$ represents an oxygen atom, a phenylene group, or a group —$(CH_2)_m$— (wherein m represents an integer from 1 to 6), and d represents 0 or 1.

The component (D) is preferably a silane compound containing 10 to 60 mol % of the compound 5 and 40 to 90 mol % of the compound 6. The target mechanical properties of the insulating film may be improved if the component (D) contains the compound 5 and the compound 6 in the above amount.

In this instance, the amount of the compound 5 is preferably 20 to 60 mol %, and more preferably 30 to 50 mol %. The amount of the compound 6 is preferably 40 to 80 mol %, and more preferably 50 to 70 mol %.

(i) Compound 5

As examples of the alkyl group and the aryl group represented by $R^{15}$ and $R^{16}$ in the formula (5), the same groups given as examples of the alkyl group and the aryl group represented by $R^1$ and $R^2$ in the formula (1) can be given.

As specific examples of the compound 5, methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyl-iso-triethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, and phenyltriphenoxysilane can be given. These compounds may be used individually or in combination of two or more.

(ii) Compound 6

As examples of the alkyl group and the aryl group represented by $R^{17}$ in the formula (6), the same groups given as examples of the alkyl group and the aryl group represented by $R^1$ and $R^2$ in the formula (1) can be given.

As specific examples of the compound 6, tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, and the like can be given. Of these, tetramethoxysilane and tetraethoxysilane are particularly preferable. These compounds may be used individually or in combination of two or more.

(iii) Compound 7

As examples of the alkyl group and the aryl group represented by $R^{18}$ and $R^{19}$ in the formula (7), the same groups given as examples of the alkyl group and the aryl group represented by $R^1$ and $R^2$ in the formula (1) can be given.

As specific examples of the compound 7, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldi-phenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldi-phenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldi-phenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, and diphenyldiphenoxysilane can be given. These compounds may be used individually or in combination of two or more.

(iv) Compound 8

As examples of the alkyl group and the aryl group represented by $R^{21}$ to $R^{24}$ in the formula (8), the same groups given as examples of the alkyl group and the aryl group represented by $R^1$ and $R^2$ in the formula (1) can be given.

Specific examples of the compound 8 are the same compounds given as examples of the compound 3.

1.1.2-2. Production of Hydrolysis-condensation Product 2

The hydrolysis-condensation product P2 may be produced by hydrolyzing and condensing the component (D). The hydrolysis and condensation of the component (D) may be carried out in the presence of a metal chelate compound, an acidic catalyst, or a basic catalyst. The basic catalyst may be the basic catalyst (C) used for producing the hydrolysis-condensation product P1. The metal chelate compound and the acidic catalyst are described below.

(i) Metal Chelate Compound

The metal chelate compound which may be used for hydrolysis and condensation of the component (D) is shown by the following formula (9),

$$R^{26}{}_{beta}M(OR^{27})_{alpha-beta} \tag{9}$$

wherein $R^{26}$ represents a chelating agent, M represents a metallic atom, $R^{27}$ represents an alkyl group having 2 to 5 carbon atoms or an aryl group having 6 to 20 carbon atoms, alpha represents the valence of the metal M, and beta represents an integer from 1 to alpha.

As the metal M, at least one metal selected from III-B metals (aluminum, gallium, indium, and thallium) and IV-A metals (titanium, zirconium, and hafnium) is preferable, and titanium, aluminum and zirconium are more preferable.

Specific examples of the metal chelate compound include titanium chelate compounds such as triethoxy-mono(acetylacetonate)titanium, tri-n-propoxy-mono(acetylacetonate)titanium, tri-iso-propoxy-mono(acetylacetonate)titanium, tri-n-butoxy-mono(acetylacetonate)titanium, tri-sec-butoxy-mono(acetylacetonate)titanium, tri-tert-butoxy-mono(acetylacetonate)titanium, diethoxy bis(acetylacetonate) titanium, di-n-propoxy bis(acetylacetonate)titanium, diisopropoxy bis(acetylacetonate)titanium, di-n-butoxy bis(acetylacetonate)titanium, di-sec-butoxy bis(acetylacetonate)titanium, di-tert-butoxy bis(acetylacetonate)titanium, mono-ethoxy tris(acetylacetonate)titanium, mono-n-propoxy tris(acetylacetonate)titanium, mono-iso-propoxy tris(acetylacetonate)titanium, mono-n-butoxy tris(acetylacetonate)titanium, mono-sec-butoxy tris(acetylacetonate) titanium, mono-tert-butoxy tris(acetylacetonate)titanium, tetrakis(acetylacetonate)titanium, triethoxy-mono(ethylacetoacetate)titanium, tri-n-propoxy-mono(ethylacetoacetate)titanium, tri-iso-propoxy-mono(ethylacetoacetate)titanium, tri-n-butoxy-mono(ethylacetoacetate)titanium, tri-sec-butoxy-mono(ethylacetoacetate)titanium, tri-tert-butoxy-mono(ethylacetoacetate)titanium, diethoxy bis(ethylacetoacetate) titanium, di-n-propoxy bis(ethylacetoacetate)titanium, diisopropoxy bis(ethylacetoacetate)titanium, di-n-butoxy bis(ethylacetoacetate)titanium, di-sec-butoxy bis(ethylacetoacetate)titanium, di-tert-butoxy bis(ethylacetoacetate)titanium, mono-ethoxy tris(ethylacetoacetate)titanium, mono-n-propoxy tris(ethylacetoacetate)titanium, mono-iso-propoxy tris(ethylacetoacetate)titanium, mono-n-butoxy tris(ethylacetoacetate)titanium, mono-sec-butoxy tris(ethylacetoacetate)titanium, mono-tert-butoxy tris(ethylacetoacetate)titanium, tetrakis(ethylacetoacetate) titanium, mono(acetylacetonate)tris(ethylacetoacetate) titanium, bis(acetylacetonate)bis(ethylacetoacetate) titanium, and tris(acetylacetonate)-mono(ethylacetoacetate) titanium; zirconium chelate compounds such as triethoxy-mono(acetylacetonate)zirconium, tri-n-propoxy-mono(acetylacetonate)zirconium, tri-iso-propoxy-mono(acetylacetonate)zirconium, tri-n-butoxy-mono(acetylacetonate)zirconium, tri-sec-butoxy-mono(acetylacetonate)zirconium, tri-tert-butoxy-mono(acetylacetonate)zirconium, diethoxy bis(acetylacetonate) zirconium, di-n-propoxy bis(acetylacetonate)zirconium, diisopropoxy bis(acetylacetonate)zirconium, di-n-butoxy bis(acetylacetonate)zirconium, di-sec-butoxy bis(acetylacetonate)zirconium, di-tert-butoxy bis(acetylacetonate)zirconium, mono-ethoxy tris(acetylacetonate)zirconium, mono-n-propoxy tris(acetylacetonate)zirconium, mono-iso-propoxy tris(acetylacetonate)zirconium, mono-n-butoxy tris(acetylacetonate)zirconium, mono-sec-butoxy tris(acetylacetonate)zirconium, mono-tert-butoxy tris(acetylacetonate)zirconium, tetrakis(acetylacetonate)zirconium, triethoxy mono-(ethylacetoacetate)zirconium, tri-n-propoxy-mono(ethylacetoacetate)zirconium, tri-iso-propoxy-mono(ethylacetoacetate)zirconium, tri-n-butoxy-mono(ethylacetoacetate)zirconium, tri-sec-butoxy-mono(ethylacetoacetate)zirconium, tri-tert-butoxy-mono(ethylacetoacetate)zirconium, diethoxy bis(ethylacetoacetate)zirconium, di-n-propoxy bis(ethylacetoacetate)zirconium, diisopropoxy bis(ethylacetoacetate)zirconium, di-n-butoxy bis(ethylacetoacetate)zirconium, di-sec-butoxy bis(ethylacetoacetate)zirconium, di-tert-butoxy bis(ethylacetoacetate)zirconium, mono-ethoxy tris(ethylacetoacetate)zirconium, mono-n-propoxy tris(ethylacetoacetate)zirconium, mono-iso-propoxy tris(ethylacetoacetate)zirconium, mono-n-butoxy tris(ethylacetoacetate)zirconium, mono-sec-butoxy tris(ethylacetoacetate)zirconium, mono-tert-butoxy tris(ethylacetoacetate)zirconium, tetrakis(ethylacetoacetate) zirconium, mono-(acetylacetonate)tris(ethylacetoacetate) zirconium, bis(acetylacetonate)bis(ethylacetoacetate) zirconium, tris(acetylacetonate)-mono(ethylacetoacetate) zirconium; and aluminum chelate compounds such as triethoxy-mono(acetylacetonate)aluminum, tri-n-propoxy-mono(acetylacetonate)aluminum, tri-iso-propoxy-mono(acetylacetonate)aluminum, tri-n-butoxy-mono(acetylacetonate)aluminum, tri-sec-butoxy-mono(acetylacetonate) aluminum, tri-tert-butoxy-mono(acetylacetonate)aluminum, diethoxy bis(acetylacetonate)aluminum, di-n-propoxy bis(acetylacetonate)aluminum, diisopropoxy bis(acetylacetonate)aluminum, di-n-butoxy bis(acetylacetonate)aluminum, di-sec-butoxy bis(acetylacetonate)aluminum, di-tert-butoxy bis(acetylacetonate)aluminum, mono-ethoxy tris(acetylacetonate)alurninum, mono-n-propoxy tris(acetylacetonate) aluminum, mono-iso-propoxy tris(acetylacetonate)aluminum, mono-n-butoxy tris(acetylacetonate)aluminum, mono-sec-butoxy tris(acetylacetonate)aluminum, mono-tert-butoxy tris(acetylacetonate)aluminum, tetrakis(acetylacetonate)aluminum, triethoxy-mono(ethylacetoacetate)aluminum, tri-n-propoxy-mono(ethylacetoacetate)aluminum, tri-iso-propoxy-mono(ethylacetoacetate)aluminum, tri-n-butoxy-mono(ethylacetoacetate)aluminum, tri-sec-butoxy-mono(ethylacetoacetate)aluminum, tri-tert-butoxy-mono(ethylacetoacetate)aluminum, diethoxy bis(ethylacetoacetate)aluminum, di-n-propoxy bis(ethylacetoacetate)aluminum, diisopropoxy bis(ethylacetoacetate)aluminum, di-n-butoxy bis(ethylacetoacetate)aluminum, di-sec-butoxy bis(ethylacetoacetate)aluminum, di-tert-butoxy bis(ethylacetoacetate)aluminum, mono-ethoxy tris(ethylacetoacetate)aluminum, mono-n-propoxy tris(ethylacetoacetate)aluminum, mono-iso-propoxy tris(ethylacetoacetate)aluminum, mono-n-butoxy tris(ethylacetoacetate)aluminum, mono-sec-butoxy tris(ethylacetoacetate)aluminum, mono-tert-butoxy tris(ethylacetoacetate)aluminum, tetrakis(ethylacetoacetate) aluminum, mono-(acetylacetonate) tris(ethylacetoacetate) aluminum, bis(acetylacetonate) bis(ethylacetoacetate) aluminum, and tris(acetylacetonate)-mono(ethylacetoacetate)aluminum. One or more of these metal chelate compounds are preferably used.

In particular, one or more of $(CH_3(CH_3)HCO)_{4-t}Ti(CH_3COCH_2COCH_3)_t$, $(CH_3(CH_3)HCO)_{4-t}Ti(CH_3COCH_2COOC_2H_5)_t$, $(C_4H_9O)_{4-t}Ti(CH_3COCH_2COCH_3)_t$, $(C_4H_9O)_{4-t}Ti(CH_3COCH_2COOC_2H_5)_t$, $(C_2H_5(CH_3)CO)_{4-t}Ti(CH_3COCH_2COCH_3)_t$, $(C_2H_5(CH_3)CO)_{4-t}Ti(CH_3COCH_2COOC_2H_5)_t$, $(CH_3(CH_3)HCO)_{4-t}Zr(CH_3COCH_2COCH_3)_t$, $(CH_3(CH_3)HCO)_{4-t}Zr(CH_3COCH_2COOC_2H_5)_t$, $(C_4H_9O)_{4-t}Zr(CH_3COCH_2COCH_3)_t$, $(C_4H_9O)_{4-t}Zr(CH_3COCH_2COOC_2H_5)_t$, $(C_2H_5(CH_3)CO)_{4-t}Zr(CH_3COCH_2COCH_3)_t$, $(C_2H_5(CH_3)CO)_{4-t}Zr(CH_3COCH_2COOC_2H_5)_t$, $(CH_3(CH_3)HCO)_{3-t}Al(CH_3COCH_2COCH_3)_t$, $(CH_3(CH_3)HCO)_{3-t}Al(CH_3COCH_2COOC_2H_5)_t$, $(C_4H_9O)_{3-t}Al(CH_3COCH_2COCH_3)_t$, $(C_4H_9O)_{3-t}Al(CH_3COCH_2COOC_2H_5)_t$, $(C_2H_5(CH_3)CO)_{3-t}Al(CH_3COCH_2COCH_3)_t$, and $(C_2H_5(CH_3)CO)_{3-t}Al(CH_3COCH_2COOC_2H_5)_t$ are preferable as the metal chelate compound that can be used.

The amount of the metal chelate compound is 0.0001 to 10 parts by weight, and preferably 0.001 to 5 parts by weight for 100 parts by weight of the total amount of the component (D)

(presumed to be completely hydrolyzed and condensed) at the time of hydrolysis and condensation. If the metal chelate compound is used in an amount of less than 0.0001 part by weight, coatability of the film may be impaired, and if more than 10 parts by weight, growth of polymers may not be controlled, which may lead to gellation. The metal chelate compound may be previously added to the organic solvent together with the component (D) at the time of hydrolysis and condensation, or may be dissolved or dispersed in water when adding the water.

When the component (D) is hydrolyzed and condensed in the presence of the metal chelate compound, it is preferable to use 0.5 to 20 mol of water, and particularly preferable to use 1 to 10 mol of water, for 1 mol of the total amount of the component (D). If the amount of water is less than 0.5 mol, the hydrolysis and condensation reaction does not proceed sufficiently, which may cause problems in applicability and storage stability. If more than 20 mol, polymer deposition and gelling may occur during the hydrolysis and condensation reaction. Water is preferably added intermittently or continuously.

(ii) Acidic Catalyst

Organic acid or inorganic acid may be used as the acidic catalyst during hydrolysis and condensation of the compound (D). Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, maleic anhydride, fumaric acid, itaconic acid, succinic acid, mesaconic acid, citraconic acid, malic acid, malonic acid, hydrolysate of glutaric acid, hydrolysate of maleic anhydride, hydrolysate of phthalic anhydride, and the like. As examples of the inorganic acid, hydrochloric acid, nitric acid, sulfuric acid, fluoric acid, phosphoric acid, and the like can be given. Among these, organic acids are preferable due to small possibility of polymer deposition and gelling during the hydrolysis and condensation reaction. A compound having a carboxyl group is more preferable. A hydrolysis and condensation product obtained by using acetic acid, oxalic acid, maleic acid, formic acid, malonic acid, phthalic acid, fumaric acid, itaconic acid, succinic acid, mesaconic acid, citraconic acid, malic acid, malonic acid, glutaric acid, or maleic anhydride is particularly preferable. The acid catalysts may be used individually or in combination of two or more.

The amount of the acidic catalyst is 0.0001 to 10 parts by weight, and preferably 0.001 to 5 parts by weight, for 100 parts by weight of the total amount of the component (D) (presumed to be completely hydrolyzed and condensed) at the time of hydrolysis and condensation. If the acidic catalyst is used in an amount of less than 0.0001 part by weight, coatability of the film may be impaired, and if more than 10 parts by weight, the hydrolysis and condensation reaction may proceed too rapidly, which may lead to gellation. The acidic catalyst may be previously added to the organic solvent together with the component (D) at the time of hydrolysis and condensation, or may be dissolved or dispersed in water when adding the water.

When the component (D) is hydrolyzed and condensed in the presence of the acidic catalyst, it is preferable to use 0.5 to 20 mol of water, and particularly preferable to use 1 to 10 mol of water, for 1 mol of the total amount of the component (D). If the amount of water is less than 0.5 mol, the hydrolysis and condensation reaction does not proceed sufficiently, which may cause problems in applicability and storage stability. If more than 20 mol, polymer deposition and gelling may occur during the hydrolysis and condensation reaction. Water is preferably added intermittently or continuously.

1.1.3. Organic Solvent

The above mentioned silane compounds may be hydrolyzed and condensed in an organic solvent when preparing the hydrolysis-condensation products P1 and P2. Among the organic solvents described below, the organic solvent shown by the following formula (10) is preferably used,

$$R^{28}O(CHCH_3CH_2O)_{gamma}R^{29} \tag{10}$$

wherein $R^{28}$ and $R^{29}$ individually represent a hydrogen atom or a monovalent organic group selected from an alkyl group having 1 to 4 carbon atoms and a group $CH_3CO-$, and gamma is an integer of 1 to 2.

As examples of the alkyl group having 1 to 4 carbon atoms in the formula (10), the same compounds given as the examples of the alkyl group in the formula (1) can be given.

Specific examples of the organic solvent shown by the formula (10) include propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropylene glycol monobutyl ether, dipropylene glycol dimethyl ether, dipropylene glycol diethyl ether, dipropylene glycol dipropyl ether, dipropylene glycol dibutyl ether, propylene glycol monomethyl ether acetate, propylene glycol monoethyl ether acetate, propylene glycol monoprolyl ether acetate, propylene glycol monobutyl ether acetate, dipropylene glycol monomethyl ether acetate, dipropylene glycol monoethyl ether acetate, dipropylene glycol monopropyl ether acetate, dipropylene glycol monobutyl ether acetate, propylene glycol diacetate, dipropylene glycol diacetate, and the like. Propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are particularly preferable. These solvents may be used individually or in combination of two or more. These solvent may contain some amount of other solvents such as an ester solvent and an amide solvent together with the solvent shown by the formula (10).

1.1.4. Composition of Organic Silica Sol

The carbon atom content in the organic silica sol is 11 to 17 atom % in the film-forming composition according to one embodiment of the invention. If the carbon content in the organic silica sol is less than 11 atom %, diffusion obstruction at the time of the solid phase reaction is high, and the reaction proceeds only with difficulty even when ultraviolet radiation is applied. If the carbon content in the organic silica sol is more than 17 atom %, molecular motility becomes too active, leading to a low modulus of elasticity which, in some cases, may cause the film to exhibit a glass transition. The carbon content of the organic silica sol refers to the percentage of carbon atoms in the organic silica sol, and is determined by the elemental composition of the organic silica sol in which the hydrolysable groups in the components, including the component (A), the component (B) when the component (B) is used, and the component (D) when the component (D) is used, used for the preparation of the organic silica sol have been completely hydrolyzed into silanol groups, and the silanol groups have been completely condensed to form siloxane bonds. Specifically, the carbon content is calculated using the following formula.

Carbon content (atom %)=(number of carbon atoms in organic silica sol)/(total number of atoms in organic silica sol)×100

The weight average molecular weight of the organic silica sol may be 500 to 500,000 in the film-forming composition according to one embodiment of the invention. If the weight average molecular weight of the organic silica sol exceeds this range, particles are easily produced and pores in the organic silica film become too large. If the weight average molecular weight of the organic silica sol is below this range, coatability and storage stability may be impaired.

The film-forming composition according to one embodiment of the invention may not contain a reaction accelerator to accelerate the hydrolysis reaction and/or the condensation reaction of the organic silica sol. The term "reaction accelerator" means one of, or a combination of two or more of, a reaction initiator, a catalyst (acid generator or base generator), and a photosensitizer having a ultraviolet absorption function. As mentioned above, the silica film cured by using an acid generator or a base generator usually has many residual silanols and high hygroscopicity. As a result, the film has a high relative dielectric constant. Furthermore, the composition having an acid generator or a base generator may not satisfy the quality of an insulating film for LSI semiconductor devices requiring high insulation reliability, because the acid generator, the base generator, or the acid or base materials generated by the acid generator or the base generator becomes an electric charge carrier which impairs insulation and degrades metal wires. These problems may be avoided according to one embodiment of the invention since the film-forming composition may be cured with heat and ultraviolet radiation without a reaction accelerator.

In the film-forming composition according to one embodiment of the invention, it is preferable that the sodium content, the potassium content, and the iron content be respectively 100 ppb or less. These elements are a source of contamination in semiconductor devices, and it is preferable to remove these elements as far as possible.

The total solid content in the film-forming composition according to one embodiment of the invention is preferably 0.1 to 20 wt %, which may be appropriately adjusted according to the purpose of use. By having the total solid content of the film-forming composition according to one embodiment of the invention at 0.1 to 20 wt %, a suitable thickness of the coated film and better storage stability may be obtained. If necessary, the total solid content may be adjusted by concentration or dilution with an organic solvent.

1.2. Organic Solvent

As the organic solvent which may be used in the film-forming composition according to one embodiment of the invention, at least one solvent selected from the group consisting of an alcohol solvent, a ketone solvent, an amide solvent, an ether solvent, an ester solvent, an aliphatic hydrocarbon solvent, an aromatic solvent, and a halogen-containing solvent may be used.

The following solvents can be given as examples of the alcohol solvent: monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-polyethylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like. These alcohol solvents may be used individually or in combination of two or more.

As examples of the ketone solvent, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonanone, cyclopentanone, cyclohexanone, cycloheptanone, cyclooctanone, 2-hexanone, methylcyclohexanone, 2,4-pentanedione, acetonylacetone, diacetone alcohol, acetophenone, fenchone, and the like can be given. These ketone solvents may be used individually or in combination of two or more.

As examples of the amide solvent, nitrogen-containing solvents such as N,N-dimethylimidazolidinone, N-methylformamide, N,N-dimethylformamide, N,N-diethylformamide, acetamide, N-methylacetamide, N,N-dimethylacetamide, N-methylpropioneamide, N-methylpyrrolidone, and the like can be given. These amide solvents may be used individually or in combination of two or more.

As examples of the ether solvent, ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol dimethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, 2-methyltetrahydrofuran, diphenyl ether, anisole, and the like can be given. These ether solvents may be used individually or in combination of two or more.

As examples of the ester solvent, diethyl carbonate, propylene carbonate, methyl acetate, ethyl acetate, gamma-butyrolactone, gamma-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like can be given. These ester solvents may be used individually or in combination of two or more.

As examples of the aliphatic hydrocarbon solvent, n-pentane, i-pentane, n-hexane, i-hexane, n-heptane, i-heptane, 2,2,4-trimethylpentane, n-octane, i-octane, cyclohexane, methylcyclohexane, and the like can be given. These aliphatic hydrocarbon solvents may be used individually or in combination of two or more.

As examples of the aromatic hydrocarbon solvent, benzene, toluene, xylene, ethylbenzene, trimethylbenzene, methylethylbenzene, n-propylebenzene, i-propylebenzene, diethylbenzene, i-butylbenzene, triethylbenzene, di-i-propylbenzene, n-amylnaphthalene, trimethylbenzene, and the like can be given. These aromatic hydrocarbon solvents may be used individually or in combination of two or more. As examples of the halogen-containing solvent, dichrolomethane, chloroform, freon, chlorobenzene, dichlorobenzene, and the like can be given.

In the film-forming composition according to one embodiment of the invention, it is preferable to use an organic solvent having a boiling point of less than 150° C. As the type of the solvent, an alcohol solvent, a ketone solvent, and an ester solvent are particularly preferable. It is more preferable to use one or more of these solvents.

1.4. Other Additives

The film-forming composition according to one embodiment of the invention may further contain an organic polymer, a surfactant, a silane coupling agent, and the like. These additives may be added to the solvent in which the components before preparing the film-forming composition according to one embodiment of the invention are either dissolved or dispersed.

1.4.1. Organic Polymer

The organic polymer used in the film-forming composition according to one embodiment of the invention may be added as a decomposable component to form pores in the silica films. The addition of these organic polymers is disclosed in references such as JP-A-2000-290590, JP-A-2000-313612, and "Templating Nanoporosity in Thin Film Dielectric Insulators" by Hedrick, J. L., et al., Adv. Mater., 10 (13), 1049, 1998. The organic polymer similar to the polymer described in the references may also be used.

As examples of the organic polymer, a polymer having a sugar chain structure, a vinyl amide polymer, a (meth)acrylic polymer, an aromatic vinyl compound polymer, a dendrimer, a polyimide, a polyamic acid, a polyarylene, a polyamide, a polyquinoxaline, a polyoxadiazole, a fluorine polymer, a polymer having a polyalkylene oxide structure, and the like can be given.

1.4.2. Surfactant

As examples of the surfactant, a nonionic surfactant, an anionic surfactant, a cationic surfactant, an amphoteric surfactant, and the like can be given. Specific examples include a fluorine-containing surfactant, a silicone surfactant, a polyalkylene oxide surfactant, a poly(meth)acrylate surfactant, and the like. Of these, the fluorine-containing surfactant and the silicone surfactant are preferable.

As examples of the fluorine-containing surfactant, compounds having a fluoroalkyl or fluoroalkylene group in at least one of the molecular terminal, main chain, and side chain, such as 1,1,2,2-tetrafluorooctyl(1,1,2,2-tetrafluoropropyl)ether, 1,1,2,2-tetrafluorooctyl hexyl ether, octaethylene glycol di(1,1,2,2-tetrafluorobutyl)ether, hexaethylene glycol(1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-[3-(perfluorooctanesulfonamide)-propyl]-N,N'-dimethyl-N-carboxymethylene ammonium betaine, perfluoroalkylsulfonamide propyltrimethyl ammonium salt, perfluoroalkyl-N-ethylsulfonyl glycine salt, bis(N-perfluorooctylsulfonyl-N-ethylaminoethyl)phosphate, and monoperfluoroalkylethyl phosphate can be given.

As examples of commercially available products of the fluorine-containing surfactant, Megafac F142D, F172, F173, F183 (manufactured by Dainippon Ink and Chemicals, Inc.), Eftop EF301, EF303, EF352 (manufactured by Shin-Akita Kasei Co., Ltd.), Fluorad FC-430, FC-431 (manufactured by Sumitomo 3M, Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), NBX-15 (manufactured by NEOS Co., Ltd.), and the like can be given. Among these, Megafac F172, BM-1000, BM-1100, and NBX-15 are particularly preferable.

As the silicone surfactant, SH7PA, SH21PA, SH30PA, ST94PA (manufactured by Toray-Dow Corning Silicone Co., Ltd.) and the like may be used. Among these, SH28PA and SH30PA are particularly preferable.

The surfactant is used in an amount of usually 0.00001 to 1 part by weight for 100 parts by weight of the film-forming composition. These surfactants may be used individually or in combination of two or more.

1.4.3. Silane Coupling Agent

As examples of the silane coupling agents, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3,6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane can be given. These silane coupling agents may be used individually or in combination of two or more.

2. Method for Forming Organic Silica Film

The method of forming an organic silica film according to one embodiment of the invention comprises applying the above film-forming composition to a substrate to form a coating, heating the coating, and irradiating the coating with ultraviolet rays to cure the coating. In the curing treatment, it is desirable to heat the coating while applying ultraviolet radiation. The condensation reaction of the organic silica sol can be fully attained and the target organic silica film can be obtained at a comparatively low temperature in a short period of time by heating the coating while applying ultraviolet radiation. The curing can be carried out preferably in 30 seconds to 10 minutes, and more preferably in 30 seconds to 7 minutes by heating while applying ultraviolet radiation.

Since the method of forming the organic silica film according to one embodiment of the invention can cure the film at a low temperature in a short period of time, a sheet-feed process can be used in the manufacture of LSI without damage to semiconductor devices.

The curing method of the coated film is described below in detail.

Ultraviolet rays with a wavelength of 250 nm or less, preferably 150 to 250 nm may be used in the ultraviolet radiation. Ultraviolet rays with a wavelength in this range can complete the condensation reaction of the molecule in the organic silica sol at a low temperature in a short time without using a reaction accelerator suitable for ultraviolet radiation. If the wavelength of ultraviolet rays is more than 250 nm, the condensation reaction of the organic silica sol is not sufficiently accelerated. If the wavelength is less than 150 nm, the organic group in the organic silica sol is easily decomposed or dissociated from the silicon atom.

It is preferable to use a light source emitting a number of light rays with different wavelengths of 250 nm or less when applying ultraviolet radiation in order to prevent a local change in film properties due to standing waves caused by reflection of the substrate to which the film-forming composition is applied.

In the method of forming an organic silica film according to one embodiment of the invention, the heating temperature during curing the coating is preferably from 300 to 450° C. If the temperature is lower than 300° C., motility of the molecular chains in the organic silica sol remains inactive. A sufficiently high rate of condensation cannot be achieved. If the heating temperature is higher than 450° C., the molecules in the organic silica sol are easily decomposed. In addition, a temperature higher than 450° C. precludes the other steps in the semiconductor device manufacturing process which are usually performed at a temperature of 450° C. or less, such as a copper damascene process. A hot plate, infrared lamp annealing, and the like may be used for heating while applying ultraviolet irradiation.

In the method of forming an organic silica film according to one embodiment of the invention, the coating may be cured in an inert atmosphere or under reduced pressure. In the curing treatment, it is particularly preferable to apply ultraviolet radiation in the absence of oxygen. The term "absence of oxygen" refers to the conditions in which the oxygen partial pressure is preferably 0.5 kPa or less, more preferably 0.1 kPa or less, and particularly preferably 0.01 kPa or less. If the oxygen partial pressure is more than 0.5 kPa, ozone is produced during the ultraviolet radiation. The ozone oxidizes the silica sol condensate and increases hydrophilicity of the resulting organic silica film, which easily induces an increase in the moisture absorption and the relative dielectric constant of the film. An organic silica film which is highly hydrophobic and does not easily induce an increase in the relative dielectric constant can be obtained by curing in the absence of oxygen.

In the method of forming an organic silica film of the embodiment, ultraviolet radiation may be applied in an inert gas atmosphere. The inert gas that can be used includes $N_2$, He, Ar, Kr, and Xe. Of these, He and Ar are preferable. The film is oxidized only with difficulty by applying ultraviolet radiation an inert gas atmosphere, whereby the relative dielectric constant of the film can be maintained at a low level.

In the method of forming an organic silica film according to one embodiment of the invention, ultraviolet radiation may be applied either under pressure or under reduced pressure. The pressure is preferably from 0.001 to 1000 kPa, and more preferably from 0.001 to 101.3 kPa. If the pressure is outside of the above range, the degree of curing may not be uniform throughout a plane. In order to control the curing rate of the coating, the coating may be heated stepwise, or an inert gas atmosphere such as nitrogen or reduced pressure may be selected as required.

As examples of the substrate on which the film-forming composition is applied, layers of an Si-containing material such as Si, $SiO_2$, SiN, SiC, and SiCN can be given. As the method of applying the film-forming composition on the substrate, spin coating, an immersing method, a roll-coating method, a spray method, and the like can be given. After applying the film-forming composition to a substrate, the solvent is removed to form a coated film. A film with a thickness after drying of 0.05 to 2.5 micrometers (in the case of one application) or 0.1 to 5.0 micrometers (in the case of duplicate application) may be formed. An organic silica film can be obtained by subjecting the resulting coated film to the above-mentioned curing treatment.

3. Organic Silica Film

As clear from the later-described examples, the organic silica film according to one embodiment of the invention has an extremely high modulus of elasticity and film density, and a low relative dielectric constant. Based on the high modulus of elasticity, it can be said that the organic silica film according to one embodiment of the invention has a sufficiently high crosslinking density. Specifically, the organic silica film of the embodiment has a relative dielectric constant of preferably 1.5 to 3.5, more preferably 1.8 to 3.0, and still more preferably 1.8 to 2.5, a modulus of elasticity of preferably 3.0 to 15.0 GPa, and more preferably 4.0 to 12.0 GPa, and a film density of preferably 0.7 to 1.3 $g/cm^3$, and more preferably 0.8 to 1.27 $g/cm^3$. Based on these property values, the organic silica film according to one embodiment of the invention can be regarded as possessing extremely excellent mechanical characteristics and insulation film characteristics such as a relative dielectric constant.

The organic silica film according to one embodiment of the invention has a contact angle with water of preferably 60° or more, more preferably 70° or more, and still more preferably 800 or more. This indicates that the organic silica film according to one embodiment of the invention is hydrophobic. Since the organic silica film exhibits low hygroscopicity, a low relative dielectric constant can be maintained. Due to the low hygroscopicity, the organic silica film is damaged only with difficulty by RIE used in a semiconductor manufacturing process and has excellent resistance to a wet cleaning liquid. This tendency is particularly remarkable in the case of the organic silica film with a low relative dielectric constant k of 2.5 or less in which the insulation film itself has a porous structure.

As mentioned above, the organic silica film according to one embodiment of the invention has the following characteristics:

(a) since the film-forming composition has a specific composition and specific carbon content, the film has excellent insulation film characteristics such as a relative dielectric constant and modulus of elasticity and can formed in a short time at a low temperature, (b) since the film-forming composition need not contain ionic substances such as a photoacid generator, a photobase generator, and a photosensitizer reactive to ultraviolet radiation, or a source of a charge carrier or a corrosive compound, the film does not contain a substance that may pollute semiconductor devices, (c) since damages to a transistor structure in a semiconductor process such as RIE and wet etching are very small when using the organic silica film, the organic silica film can be cured by a sheet-feed process, (d) since the organic silica film is highly hydrophobic and exhibits low hygroscopicity, a low relative dielectric constant can be maintained, and (e) since the organic silica film excels in mechanical characteristics such as modulus of elasticity, the film can be used for forming a copper damascene structure.

In the film-forming composition according to one embodiment of the invention, motility of the molecular weight chains is increased and residual silanol remaining after curing can be reduced due to inclusion of the hydrolysis-condensation product P1 prepared by using the component (A) in which the proportion of the compound 2 (component Q) is 40 mol % or less. Such a film-forming composition was confirmed to produce a film having low hygroscopicity as compared with films requiring a long time for heat curing if applied and dried on a substrate and heated while applying ultraviolet radiation preferably in the absence of oxygen. Although a detailed mechanism is not known, use of the film-forming composition with a reduced content of the component Q and heating during curing are considered to lower the diffusion obstruction at the time of the solid phase reaction, and ultraviolet radiation is considered to increase probability of the reaction in excited sites.

In other words, in the film-forming composition according to one embodiment of the invention, the condensation degree is increased to a larger extent by heating and ultraviolet radiation in a short period of time as compared with a general composition requiring a long time for curing with heat. The increase in the degree of condensation indicates a decrease of residual silanol. Due to the feature of the composition containing a larger amount of carbonaceous components as compared with corresponding compositions in related art (for example, Example 1 of U.S. Pat. No. 6,413,647) as indicated by the carbon atom content of 11 to 17 atom % in the organic silica sol, in addition to the increased degree of condensation, the hydrophobicity of the organic silica film after curing dramatically increases. The increase in the degree of condensation also indicates an increase of the degree of crosslinking, which results in improvement of mechanical strength such as modulus of elasticity.

Furthermore, since the film-forming composition according to one embodiment of the invention contains the hydrolysis-condensation product P1 prepared by using the component (A) in which the proportion of the compound 2 (component Q) is 40 mol % or less, a film exhibiting a modulus of elasticity equivalent to or larger than the modulus of elasticity of the film obtained from a composition which contains a hydrolysis-condensation product prepared by using the component (A) in which the proportion of the component Q is more than 40 mol %, can be obtained by curing with heating while applying ultraviolet radiation. In this manner, an organic silica film with sufficient hydrophobicity and high modulus of elasticity can be obtained from the film-forming composition according to one embodiment of the invention.

In the film-forming composition according to one embodiment of the invention, motility of the molecular chains is increased and residual silanol remaining after curing can be reduced particularly due to inclusion of the hydrolysis-condensation product P1 prepared by using the component (A), which does not substantially contain the component Q, and the component (B) and the hydrolysis-condensation product P2 prepared by using the component (D). The organic silica film obtained from the film-forming composition by heating while applying ultraviolet radiation, preferably in the absence of oxygen, after coating and drying has low hygroscopicity and exhibits excellent mechanical characteristics and etching resistance as compared with films requiring a long time for curing with heat. In this manner, an organic silica film with sufficient hydrophobicity, high mechanical characteristics (high modulus of elasticity, crack resistance, etc.), and etching resistance can be obtained.

Due to these characteristics, the organic silica film according to one embodiment of the invention is particularly excellent as an interlayer dielectric for semiconductor devices such as LSI, system LSI, DRAM, SDRAM, RDRAM, and D-RDRAM, and can be suitably used for semiconductor devices such as an etching stopper film, an overcoat such as a surface coating for semiconductor devices, an intermediate layer in the semiconductor preparation process using multiple layer resists, an interlayer dielectric of multiple layer interconnecting substrates, and the like. The organic silica film according to one embodiment of the invention is also useful for semiconductor devices including a copper damascene process.

4. EXAMPLES

The invention will now be described in more detail by way of examples. However, these Examples should not be considered as limitations to the invention. In the Examples and Comparative Examples, "part" and "%" respectively refer to "part by weight" and "wt %" unless otherwise indicated.

4.1. Examples 1 to 5, Comparative Examples 1 to 5, and Reference Examples 1 to 8

The film-forming compositions were prepared and the silica films were formed by the following methods.

4.1.1. Preparation of Film-forming Composition

The film-forming compositions shown in Table 1 were used in Examples 1 to 5, Comparative Examples 1 to 5, and Reference Examples 1 to 8. The film-forming compositions used in Examples 1 to 5, Comparative Examples 1 to 5, and Reference Examples 1 to 8 were prepared in the later-described Synthesis Examples 1 to 6 or prepared using the hydrolysis-condensation products obtained in the later-described Preparation Examples 1 to 6.

4.1.1-1. Synthesis Example 1

A 3-liter four-neck flask equipped with a thermometer, a condenser, a dropping funnel, and a stirrer, of which the atmosphere was replaced with argon gas, was charged with 1 liter of dried tetrahydrofuran and 60 g of magnesium metal. Argon gas was then bubbled into the mixture. 467.5 g of chloromethyltriethoxysilane was slowly added to the mixture using the dropping funnel while stirring at 20° C.

After the addition, the mixture was stirred at 45° C. for 24 hours. After cooling, magnesium salt produced was removed from the reaction mixture by filtration. Then, tetrahydrofuran was removed from the filtrate by heating under reduced pressure to obtain 260.1 g of a brown liquid polymer (i) (component (B)) which has a structural unit shown by the following formula (11) (wherein n is an integer of 2 or more). The weight average molecular weight of the polymer (i) was 1200.

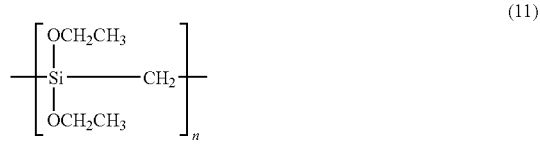

(11)

4.1.1-2. Synthesis Example 2

In a separable flask made of quartz, 17 g of the polymer (i) (component (B)) obtained in Synthesis Example 1, 49 g of methyltrimethoxysilane, 9.6 g of tetramethoxysilane (component (A)), and 15.3 g of a 25% aqueous solution of tetrapropylammonium hydroxide (TPAH) (component (C)) were dissolved in 250 g of methanol. The mixture was stirred using a three-one motor, and the solution temperature was stabilized at 55° C. Next, a mixed solution of 40 g of ion-exchanged water and 160 g of propylene glycol monoethyl ether was added over one hour.

After allowing the mixture to react at 55° C. for four hours, 20 g of a 10% propylene glycol monopropyl ether solution of acetic acid was added to the mixture. After reaction for a further 30 minutes, the reaction solution was cooled to room temperature. The reaction solution was concentrated at 50° C. under reduced pressure until the solid content was reduced to 10% to obtain a film-forming composition A. The carbon content of the hybrid polymer (film-forming composition A) obtained in this manner was 15.4 atom % and the weight average molecular weight of the condensate (hydrolysis-condensation product P1) in the composition A was 21,000.

4.1.1-3. Synthesis Example 3

A quartz flask equipped with a condenser was charged with 8.3 g of a 20% aqueous solution of tetrabutylammonium hydroxide (TBAH), 118.6 g of ultra-pure water, and 516.1 g of isopropyl alcohol. The mixture was stirred at 40° C. After the addition of 34.4 g of tetraethoxysilane and 22.5 g of methyltriethoxysilane (component (D)) continuously over one hour, the mixture was stirred at 80° C. for a further one hour. After cooling the reaction solution to room temperature, 1269.4 g of propylene glycol monopropyl ether and 55.5 g of a 20% acetic acid aqueous solution were added. The reaction solution was concentrated under reduced pressure until the solid content was reduced to 10% to obtain a film-forming composition B. The carbon content of the composition B was 10.5 atom % and the weight average molecular weight of the condensate (hydrolysis-condensation product P2) in the composition B was 52,000.

4.1.1-4. Preparation Example 1

The composition A obtained in Synthesis Example 2 and the composition B obtained in Synthesis Example 3 were mixed so that the ratio of A:B was 80:20, to obtain a composition C. The carbon content of the composition C was 14.4 atom % and the weight average molecular weight of the mixture of the hydrolysis-condensation products (P1 and P2) in the composition C was 26,000.

4.1.1-5. Preparation Example 2

The composition A obtained in Synthesis Example 2 and the composition B obtained in Synthesis Example 3 were mixed so that the ratio of A:B was 50:50, to obtain a composition D. The carbon content of the composition D was 13.0 atom % and the weight average molecular weight of the mixture (mixture of hydrolysis-condensation products P1 and P2) in the composition D was 34,000.

4.1.1-6. Preparation Example 3

The composition A obtained in Synthesis Example 2 and the composition B obtained in Synthesis Example 3 were mixed so that the ratio of A:B was 20:80, to obtain a composition E. The carbon content of the composition E was 11.5 atom % and the weight average molecular weight of the mixture (mixture of hydrolysis-condensation products P1 and P2) in the composition E was 47,000.

4.1.1-7. Synthesis Example 4

A 3-liter four-neck flask equipped with a thermometer, a condenser, a dropping funnel, and a stirrer, of which the atmosphere was replaced with argon gas, was charged with 1 liter of dried tetrahydrofuran and 55 g of magnesium metal. Argon gas was then bubbled into the mixture. 80.3 g of chloromethylmethyldiethoxysilane was slowly added to the mixture using the dropping funnel while stirring at 20° C.

After the addition, the mixture was stirred at 45° C. for 24 hours. After cooling, magnesium salt produced was removed from the reaction mixture by filtration. Then, tetrahydrofuran was removed from the filtrate by heating under reduced pressure to obtain 75.2 g of a brown liquid polymer (ii) (component (B)) which has a structural unit shown by the following formula (12) (wherein n is an integer of 2 or more). The weight average molecular weight of the polymer (ii) was 1400.

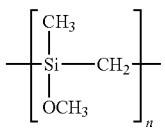

(12)

4.1.1-8. Synthesis Example 5

In a separable flask made of quartz, 3.5 g of the polymer (ii) (component (B)) obtained in Synthesis Example 4, 40 g of methyltrimethoxysilane, 3 g of tetramethoxysilane (component (A)), and 40 mg of triethylamine (component (C)) were dissolved in 250 g of methanol. The mixture was stirred using a three-one motor, and the solution temperature was stabilized at 55° C. Next, a mixed solution of 40 g of ion-exchanged water and 160 g of propylene glycol monoethyl ether was added over one hour.

After allowing the mixture to react at 55° C. for four hours, 8 g of a 10% propylene glycol monopropyl ether solution of acetic acid was added to the mixture. After reaction for a further 30 minutes, the reaction solution was cooled to room temperature. The reaction solution was concentrated at 50° C. under reduced pressure until the solid content was reduced to 10% to obtain a film-forming composition F. The carbon content of the condensate obtained in this manner was 15.7 atom % and the weight average molecular weight of the condensate (hydrolysis-condensation product P1) in the composition F was 28,000.

4.1.1-9. Synthesis Example 6

A quartz flask equipped with a condenser was charged with 20.4 g of a 20% aqueous solution of tetrapropylammonium hydroxide, 417.6 g of ultra-pure water, and 862.9 g of isopropyl alcohol. The mixture was stirred at 40° C. After the addition of 69.4 g of tetraethoxysilane and 30.3 g of methyltrimethoxysilane (component (D)) continuously over one hour, the mixture was stirred at 80° C. for a further 30 minutes. After cooling the reaction solution to room temperature, 2002.5 g of propylene glycol monopropyl ether and 20.7 g of a 20% butylic acid aqueous solution were added. The reaction solution was concentrated under reduced pressure until the solid content was reduced to 10% to obtain a film-forming composition G The carbon content of the composition G was 7.5 atom % and the weight average molecular weight of the condensate (hydrolysis-condensation product P2) in the composition G was 73,000.

4.1.1-10. Preparation Example 4

The composition F obtained in Synthesis Example 5 and the composition G obtained in Synthesis Example 6 were mixed so that the ratio of A:B was 80:20, to obtain a composition H. The carbon content of the composition H was 14.1 atom % and the weight average molecular weight of the mixture (a mixture of hydrolysis-condensation products P1 and P2) in the composition H was 37,000.

4.1.1-11. Preparation Example 5

The composition F obtained in Synthesis Example 5 and the composition G obtained in Synthesis Example 6 were mixed so that the ratio of A:B was 60:40, to obtain a composition J. The carbon content of the composition J was 12.4 atom % and the weight average molecular weight of the mixture (hydrolysis-condensation products P1 and P2) in the composition J was 46,000.

4.1.1-12. Preparation Example 6

The composition F obtained in Synthesis Example 5 and the composition G obtained in Synthesis Example 6 were mixed so that the ratio of A:B was 40:60, to obtain a composition K. The carbon content of the composition K was 10.8 atom % and the weight average molecular weight of the mixture (hydrolysis-condensation products P1 and P2) in the composition K was 55,000.

TABLE 1

| | | | Carbon content (atom %) | Curing method | Conditions of curing with ultraviolet radiation | | | Properties | | | | |
|---|---|---|---|---|---|---|---|---|---|---|---|---|
| | Composition | Blend | | | Temperature (° C.) | Time (min) | Oxygen partial pressure (kPa) | Relative dielectric constant | Delta k | Modulus of elasticity | Contact angle | Crack resistance |
| Example 1 | C | A:B = 80:20 | 14.4 | UV light | 400 | 3 | 0.01 | 2.49 | 0.11 | 10.7 | 92 | A |
| Example 2 | D | A:B = 50:50 | 13.0 | UV light | 400 | 3 | 0.01 | 2.45 | 0.10 | 11.0 | 86 | A |
| Example 3 | E | A:B = 20:80 | 11.5 | UV light | 400 | 3 | 0.01 | 2.39 | 0.12 | 7.9 | 81 | A |
| Comparative Example 2 | B | — | 10.5 | UV light | 400 | 3 | 0.01 | 2.24 | 0.14 | 4.3 | 76 | A |
| Example 4 | H | F:G = 80:20 | 14.1 | UV light | 400 | 3 | 0.01 | 2.34 | 0.13 | 8.1 | 92 | A |
| Example 5 | J | F:G = 60:40 | 12.4 | UV light | 400 | 3 | 0.01 | 2.32 | 0.11 | 7.5 | 84 | A |
| Comparative Example 3 | F | — | 15.7 | UV light | 400 | 3 | 0.01 | 2.35 | 0.12 | 6.3 | 99 | B |
| Comparative Example 4 | G | — | 7.5 | UV light | 400 | 3 | 0.01 | 2.18 | 0.11 | 4.1 | 65 | A |
| Comparative Example 5 | K | F:G = 40:60 | 10.8 | UV light | 400 | 3 | 0.01 | 2.31 | 0.12 | 6.3 | 76 | A |
| Reference Example 1 | C | A:B = 80:20 | 14.4 | Heat | — | — | — | 2.50 | 0.15 | 8.5 | 88 | B |
| Reference Example 2 | D | A:B = 50:50 | 13.0 | Heat | — | — | — | 2.48 | 0.17 | 8.9 | 84 | A |
| Reference Example 3 | H | F:G = 80:20 | 14.1 | Heat | — | — | — | 2.38 | 0.15 | 7.4 | 80 | B |
| Reference Example 4 | J | F:G = 60:40 | 12.4 | Heat | — | — | — | 2.34 | 0.18 | 7.2 | 81 | A |
| Reference Example 5 | C | A:B = 80:20 | 14.4 | UV light | 400 | 3 | 1.00 | 2.53 | 0.20 | 8.2 | 40 | A |
| Reference Example 6 | D | A:B = 50:50 | 13.0 | UV light | 400 | 3 | 1.00 | 2.56 | 0.22 | 8.3 | 35 | A |
| Reference Example 7 | H | F:G = 80:20 | 14.1 | UV light | 400 | 3 | 1.00 | 2.43 | 0.19 | 7.0 | 37 | A |

TABLE 1-continued

| | Composition | Blend | Carbon content (atom %) | Curing method | Conditions of curing with ultraviolet radiation | | | Properties | | | | |
| --- | --- | --- | --- | --- | --- | --- | --- | --- | --- | --- | --- | --- |
| | | | | | Temperature (° C.) | Time (min) | Oxygen partial pressure (kPa) | Relative dielectric constant | Delta k | Modulus of elasticity | Contact angle | Crack resistance |
| Reference Example 8 | J | F:G = 60:40 | 12.4 | UV light | 400 | 3 | 1.00 | 2.41 | 0.20 | 6.8 | 29 | A |

4.1.2. Formation of Organic Silica Film

The organic silica films of Examples 1 to 4, Comparative Examples 1 to 10, and Reference Examples 1 to 4 were obtained from the compositions and the curing conditions shown in Table 1.

The film-forming compositions obtained in 4.1.1. were applied to 8 inch silicon wafers by a spin coat method, and the coatings were heated at 90° C. for one minute on a hot plate and dried at 200° C. for one minute under nitrogen atmosphere. The coatings were cured by applying ultraviolet radiation while heating on the hot plate to obtain organic silica film samples. The type of the film-forming compositions and the curing conditions in Examples and Comparative Examples are shown in Table 1.

White ultraviolet light including light with a wavelength of 250 nm or less was used as a source of ultraviolet radiation. Since the ultraviolet radiation included white ultraviolet light, the luminance could not be measured by an effective method.

In the curing treatment of Examples 1 to 5 and Comparative Examples 1 to 5, the coatings were heated while applying ultraviolet radiation. On the other hand, in Reference Examples 1 to 4, the samples were obtained by only heating the coatings at 420° C. for 60 minutes without applying ultraviolet radiation. In Reference Examples 5 to 8, the coatings were heated while applying ultraviolet radiation. In Examples 1 to 5, the partial pressure of oxygen was 0.01 kPa, while the partial pressure of oxygen was 1 kPa in Reference Examples 5 to 8.

4.1.3. Evaluation Method

The organic silica films obtained in 4.1.2. and the condensates obtained in 4.1.1. were evaluated according to the following methods.

4.1.3-1. Relative Dielectric Constant, Delta k

An aluminum electrode pattern was formed by vapor deposition on the organic silica film formed by the method mentioned above on an N-type 8 inch silicon wafer having a resistivity of 0.1 ohm·cm or less. The relative dielectric constant of the organic silica film was measured using the sample by the CV method in which an electrode "HP16451B" and a precision LCR meter "HP4284A" (both manufactured by Agilent) were used at a frequency of 100 kHz.

Delta k is the difference between the relative dielectric constant (k@RT) measured in an atmosphere of 40% RH at 24° C. and the relative dielectric constant (k@200° C.) measured in a dry nitrogen atmosphere (delta k=k@RT−k@200° C.). An increase of the relative dielectric constant due to moisture absorption mainly by the film can be evaluated by delta k. Generally, a film with delta k of 1.5 or more is an organic silica film with high moisture absorption.

4.1.3-2. Modulus of Elasticity of Silica Film

Modulus of elasticity of the insulation film formed by the above-mentioned method was measured by a continuous rigidity measuring method using a supermicro hardness meter "Nanoindentator XP" equipped with a Berkovich type indenter.

4.1.3-3. Contact Angle

In order to evaluate hydrophobicity of the film, the contact angle was measured by adding ultra-pure water dropwise on the surface of the insulation film formed by the above-mentioned method using a contact angle measuring device "Drop Master 500" manufactured by Kyowa Interface Science Co., Ltd. In general, the larger the surface tension of the water droplet, the larger the contact angle and the higher the hydrophobicity of the insulation film. The higher the hydrophobicity of the insulation film, the higher the etching resistance (for example, resistance to RIE or chemicals).

4.1.3-4. Crack Resistance

Thin films with a thickness of 1 micrometer were prepared from the film-forming compositions and observed using an optical microscope (×100). A sample on which no crack was observed was evaluated to have good crack resistance and rated as "A", otherwise the sample was rated as "B".

4.1.3-5. Weight Average Molecular Weight; Mw

The weight average molecular weight of the hydrolysis-condensation product was measured by size exclusion chromatography (SEC) under the following conditions. Sample: was prepared by dissolving 0.1 g of the hydrolysis-condensation product in 100 cc of a 10 mmol/L LiBr—$H_3PO_4$ 2-methoxyethanol solution.

Standard sample: Polyethylene oxide manufactured by Wako Pure Chemical Industries, Ltd.

Measurement system: High performance GPC apparatus ("HLC-8120" manufactured by Tosoh Corp.

Column: Three "TSK-GEL SUPER AWM-H" (15 cm in length), manufactured by Tosoh Corp., installed in series Measurement temperature: 40° C.

Flow rate: 0.6 ml/min

Detector: "UV-8220 RI" manufactured by Tosoh Corp.

4.1.4. Evaluation Results

The results of evaluation of the dielectric constant, delta k, modulus of elasticity, contact angle, and crack resistance of the films obtained in Examples 1 to 5, Comparative Examples 1 to 5, and Reference Examples 1 to 8 are shown in Table 1.

The film obtained in Comparative Example 1 showed a large contact angle, indicating the hydrophobic properties, but was found to have poor crack resistance. The film obtained in Comparative Example 2 showed good crack resistance, but the contact angle value suggests small hydrophobicity of the film. In contrast, the films obtained in Examples 1 to 3 showed a larger contact angle and also exhibited good crack resistance. Furthermore, the films obtained in Examples 1 and 2 had a modulus of elasticity higher than the films obtained in Comparative Examples 1 and 2, indicating improvement of mechanical strength due to blending of the hydrolysis-condensation products P1 and P2 in the compositions. Furthermore, the films obtained in Examples 1 and 2 had a large contact angle and a modulus of elasticity higher than the films obtained in Comparative Examples 1 and 2, indicating that the blending ratio of the hydrolysis-condensation products P1 and P2 in the compositions is an important factor affecting the mechanical strength and etching resistance. The above tendencies were also found in the films obtained in Examples 4 and 5 and the films obtained in Comparative Examples 3 to 5.

In Reference Examples 1 to 4, curing was carried out only using heat without using ultraviolet radiation. It was confirmed that the films obtained in Reference Examples 1 to 4 showed a modulus of elasticity smaller than the modulus of elasticity of the films obtained in Examples 1, 2, 4, and 5. The films obtained in Reference Examples 1 and 3 were found to have poor crack resistance. Based on these results, curing by ultraviolet radiation was found to be superior to curing with heat.

Reference Examples 5 and 8 are experiments in which an oxygen rich atmosphere was used in curing with ultraviolet radiation. It can be seen that the films obtained in Reference Examples 5 to 8 showed significantly reduced values of contact angle as compared with the films obtained in Examples 1 to 5, indicating an increase in the hydrophobicity. The reason is considered to be the result of conversion of oxygen in the atmosphere into ozone by ultraviolet radiation, which is thought to have denatured the film into hydrophilic. These results indicate that the oxygen concentration of the atmosphere is preferably maintained at a low level during ultraviolet radiation.

As is clear from the above Examples, an organic silica film with a low relative dielectric constant, low hygroscopicity, high mechanical strength, and excellent etching resistance can be formed using the film-forming composition of the invention. Due to high mechanical strength, excellent etching resistance, a low relative dielectric constant, and low hygroscopicity, the organic silica film of the invention can be suitably used as an interlayer dielectric for semiconductor devices.

4.2 Examples 6 to 12, Comparative Examples 6 to 13, and Reference Examples 9 to 12

4.2.1. Preparation of Film-forming Composition

In Examples 6 to 12, Comparative Examples 6 to 13, and Reference Examples 9 to 12 described later, silica films were prepared from the compositions K to R shown in Table 2. That is, the film-forming compositions used in Examples 6 to 12, Comparative Examples 6 to 13, and Reference Examples 9 to 12 are the compositions K to R prepared in the later-described Synthesis Examples 11 to 20, or compositions I to VIII which are obtained by mixing any two compositions selected from the compositions K to R.

4.2.1-1. Synthesis Example 11

A 3-liter four-neck flask equipped with a thermometer, a condenser, a dropping funnel, and a stirrer, of which the atmosphere was replaced with argon gas, was charged with 1 liter of dried tetrahydrofuran and 60 g of magnesium metal. Argon gas was then bubbled into the mixture. 467.5 g of chloromethyltriethoxysilane was slowly added to the mixture using the dropping funnel while stirring at 20° C.

After the addition, the mixture was stirred at 45° C. for 24 hours. After cooling, magnesium salt produced was removed from the reaction mixture by filtration. Then, tetrahydrofuran was removed from the filtrate by heating under reduced pressure to obtain 260.1 g of a brown liquid polymer (i) (component (B)) which has a structural unit shown by the above formula (11) (wherein n is an integer of 2 or more). The weight average molecular weight of the polymer (i) was 1200.

4.2.1-2. Synthesis Example 12

In a separable flask made of quartz, 21 g of the polymer (i) (component (B)) obtained in Synthesis Example 11, 32 g of methyltrimethoxysilane (component (A)), and 8.3 g of a 25% aqueous solution of tetrapropylammonium hydroxide (TPAH) (component (C)) were dissolved in 500 g of methanol. The mixture was stirred using a three-one motor, and the solution temperature was stabilized at 55° C. Next, a mixed solution of 31 g of ion-exchanged water and 409 g of propylene glycol monoethyl ether was added over one hour.

After allowing the mixture to react at 55° C. for four hours, 14 g of a 10% propylene glycol monopropyl ether solution of acetic acid was added to the mixture. After reaction for a further 30 minutes, the reaction solution was cooled to room temperature. The reaction solution was concentrated at 50° C. under reduced pressure until the solid content was reduced to 10% to obtain a film-forming composition K. The carbon content of the hybrid polymer (film-forming composition K (hydrolysis-condensation product P1)) and the weight average molecular weight of the condensate in the composition K are shown in Table 2.

The spectrum data of $^{29}$Si NMR spectrum (100 MHz) of the film-forming composition K (no diluent solvent) was as follows. In the $^{29}$Si NMR measurement of the film-forming composition K, the total value of the integral of the peaks found in the range from −90 to −120 ppm was less than 0.01, when the total value of the integral of the peaks existing in 50 to −80 ppm was presumed to be 1.

−75 to −45 ppm (broad), −30 to −10 ppm (broad), 0 to 20 ppm (broad)

4.2.1-3. Synthesis Example 13

In a separable flask made of quartz, 21 g of the polymer (i) (component (B)) obtained in Synthesis Example 11, 28 g of methyltrimethoxysilane and 5.5 g of tetramethoxysilane (component (A)), and 8.7 g of a 25% aqueous solution of tetrapropylammonium hydroxide (TPAH) (component (C)) were dissolved in 498 g of methanol. The mixture was stirred using a three-one motor, and the solution temperature was stabilized at 55° C. Next, a mixed solution of 31 g of ion-exchanged water and 407 g of propylene glycol monoethyl ether was added over one hour.

After allowing the mixture to react at 55° C. for four hours, 15 g of a 10% propylene glycol monopropyl ether solution of acetic acid was added to the mixture. After reaction for a further 30 minutes, the reaction solution was cooled to room temperature. The reaction solution was concentrated at 50° C. under reduced pressure until the solid content was reduced to 10% to obtain a film-forming composition L. The carbon content of the hybrid polymer (film-forming composition L) and the weight average molecular weight of the condensate in the composition L are shown in Table 2.

The spectrum data of $^{29}$Si NMR spectrum (100 MHz) of the film-forming composition L (no diluent solvent) was as follows. In the $^{29}$Si NMR measurement of the film-forming composition L, the total value of the integral of the peaks found in the range from −90 to −120 ppm was 0.01 or more, when the total value of the integral of the peaks existing in 50 to −80 ppm was presumed to be 1.

−115 to −90 ppm (broad), −75 to −45 ppm (broad), −40 to −30 ppm (broad), −20 to 10 ppm (broad), 10 to 30 ppm (broad)

4.2.1-4. Synthesis Example 14

A quartz flask equipped with a condenser was charged with 8.3 g of a 20% aqueous solution of tetrabutylammonium hydroxide (TBAH), 118.6 g of ultra-pure water, and 516.1 g of isopropyl alcohol. The mixture was stirred at 40° C. After the addition of 34.4 g of tetraethoxysilane and 22.5 g methyltriethoxysilane (component (D)) continuously over one hour, the mixture was stirred at 80° C. for a further one hour. After cooling the reaction solution to room temperature, 1269.4 g of propylene glycol monopropyl ether and 55.5 g of a 20% acetic acid aqueous solution were added. The reaction solution was concentrated under reduced pressure until the solid content was reduced to 10% to obtain a film-forming composition M. The carbon content of the film-forming composition M and the weight average molecular weight of the condensate in the composition M are shown in Table 2.

4.2.1-5. Synthesis Example 15

A 3-liter four-neck flask equipped with a thermometer, a condenser, a dropping funnel, and a stirrer, of which the atmosphere was replaced with argon gas, was charged with 1 liter of dried tetrahydrofuran and 55 g of magnesium metal. Argon gas was then bubbled into the mixture. 67.9 g of chloromethylmethyldimethoxysilane was slowly added to the mixture using the dropping funnel while stirring at 20° C.

After the addition, the mixture was stirred at 45° C. for 24 hours. After cooling, magnesium salt produced was removed from the reaction mixture by filtration. Then, tetrahydrofuran was removed from the filtrate by heating under reduced pressure to obtain 75.2 g of a brown liquid polymer (ii) (component (B)) which has a structural unit shown by the above formula (12) (wherein n is an integer of 2 or more). The weight average molecular weight of the polymer (ii) was 1400.

4.2.1-6. Synthesis Example 16

In a separable flask made of quartz, 11 g of the polymer (ii) (component (B)) obtained in Synthesis Example 15, 34 g of methyltrimethoxysilane (component (A)), and 0.89 g of triethylamine (TEA) (component (C)) were dissolved in 507 g of methanol. The mixture was stirred using a three-one motor, and the solution temperature was stabilized at 55° C. Next, a mixed solution of 32 g of ion-exchanged water and 415 g of propylene glycol monoethyl ether was added over one hour.

After allowing the mixture to react at 55° C. for four hours, 12 g of a 10% propylene glycol monopropyl ether solution of acetic acid was added to the mixture. After the reaction for a further 30 minutes, the reaction solution was cooled to room temperature. The reaction solution was concentrated at 50° C. under reduced pressure until the solid content was reduced to 10% to obtain a film-forming composition N. The carbon content of the hybrid polymer (film-forming composition N) and the weight average molecular weight of the condensate in the composition N are shown in Table 2.

The spectrum data of $^{29}$Si NMR spectrum (100 MHz) of the film-forming composition N (no diluent solvent) was as follows. In the $^{29}$Si NMR measurement of the film-forming composition N, the total value of the integral of the peaks found in the range from −90 to −120 ppm was less than 0.01, when the total value of the integral of the peaks existing in 50 to −80 ppm was presumed to be 1.

−75 to −45 ppm (broad), −30 to −10 ppm (broad), 0 to 20 ppm (broad)

4.2.1-7. Synthesis Example 17

In a separable flask made of quartz, 11 g of the polymer (ii) (component (B)) obtained in Synthesis Example 15, 31 g of methyltrimethoxysilane, 4 g of tetramethoxysilane (component (A)), and 0.92 g of triethylamine (TEA) (component (C)) were dissolved in 506 g of methanol. The mixture was stirred using a three-one motor, and the solution temperature was stabilized at 55° C. Next, a mixed solution of 33 g of ion-exchanged water and 414 g of propylene glycol monoethyl ether was added over one hour.

After allowing the mixture to react at 55° C. for four hours, 13 g of a 10% propylene glycol monopropyl ether solution of acetic acid was added to the mixture. After the reaction for a further 30 minutes, the reaction solution was cooled to room temperature. The reaction solution was concentrated at 50° C. under reduced pressure until the solid content was reduced to 10% to obtain a film-forming composition O. The carbon content of the hybrid polymer (film-forming composition O) and the weight average molecular weight of the condensate in the composition O are shown in Table 2.

The spectrum data of $^{29}$Si NMR spectrum (100 MHz) of the film-forming composition O (no diluent solvent) was as follows. In the $^{29}$Si NMR measurement of the film-forming composition O, the total value of the integral of the peaks found in the range from −90 to −120 ppm was 0.01 or more, when the total value of the integral of the peaks existing in 50 to −80 ppm was presumed to be 1.

−115 to −90 ppm (broad), −75 to −45 ppm (broad), −40 to −30 ppm (broad), −20 to 10 ppm (broad), 10 to 30 ppm (broad)

4.2.1-8. Synthesis Example 18

A quartz flask equipped with a condenser was charged with 20.4 g of a 20% aqueous solution of tetrapropylammonium hydroxide, 417.6 g of ultra-pure water, and 862.9 g of isopropyl alcohol. The mixture was stirred at 40° C. After the addition of 69.4 g of tetraethoxysilane and 30.3 g methyltrimethoxysilane (component (D)) continuously over one hour, the mixture was stirred at 80° C. for a further 30 minutes. After cooling the reaction solution to room temperature, 2002.5 g of propylene glycol monopropyl ether and 20.7 g of a 20% butylic acid aqueous solution were added. The reaction solution was concentrated under reduced pressure until the solid content was reduced to 10% to obtain a film-forming composition P. The carbon content of the film-forming composition P and the weight average molecular weight of the condensate in the composition P are shown in Table 2.

4.2.1-9. Synthesis Example 19

In a separable quartz flask equipped with a condenser, 21 g of the polymer (i) (component (B)) obtained in Synthesis Example 11, 32 g of methyltrimethoxysilane (component (A)) were dissolved in 100 g of propylene glycol monoethyl ether. The mixture was stirred using a three-one motor, and the solution temperature was stabilized at 55° C. Next, 20 g of ion-exchanged water in which 0.10 g of oxalic acid was dissolved was added over one hour.

After reacting at 55° C. for one hour, 400 g of propylene glycol monoethyl ether was added and the mixture was cooled to room temperature. The reaction solution was concentrated under reduced pressure until the solid content was reduced to 10% to obtain a film-forming composition Q. The carbon content of the hybrid polymer (film-forming composition Q) and the weight average molecular weight of the condensate in the composition Q are shown in Table 2.

4.2.1-10. Synthesis Example 20

In a separable quartz flask equipped with a condenser, 34.4 g of tetraethoxysilane and 22.5 g of methyltriethoxysilane (component (D)) were dissolved in 100 g of propylene glycol monoethyl ether. The mixture was stirred using a three-one motor, and the solution temperature was stabilized at 55° C. Next, 100 g of ion-exchanged water in which 0.10 g of oxalic acid was dissolved was added over one hour.

After reacting at 55° C. for one hour, 400 g of propylene glycol monoethyl ether was added and the mixture was cooled to room temperature. The reaction solution was concentrated under reduced pressure until the solid content was reduced to 10% to obtain a film-forming composition R. The carbon content of the hybrid polymer (film-forming composition R) and the weight average molecular weight of the condensate in the composition N are shown in Table 2.

4.2.1-11. Preparation Example 1

The compositions K to R obtained in Synthesis Examples 11 to 20 were mixed at the mass ratios shown in Table 3 to obtain compositions I to VIII. The carbon content of each composition are shown in Table 3.

TABLE 2

| Composition | | Component (A) | | Component (B) | Component (C) | Component (D) | | Catalyst |
|---|---|---|---|---|---|---|---|---|
| Type | Carbon content (atom %) | Molecular weight | Component Q (mol %) | Component T (mol %) | (mol %) | Type | Component Q (mol %) | Component T (mol %) | Type |
| K | 17.0 | 19,000 | 0 | 60 | 40 | TPAH | — | — | — |
| L | 16.3 | 20,000 | 9 | 51 | 40 | TPAH | — | — | — |
| M | 10.5 | 52,000 | — | — | — | — | 50 | 50 | TBAH |
| N | 18.6 | 21,000 | 0 | 67 | 33 | TEA | — | — | — |
| O | 18.2 | 23,000 | 7 | 60 | 33 | TEA | — | — | — |
| P | 7.5 | 73,000 | — | — | — | — | 60 | 40 | TPAH |
| Q | 17.0 | 2,600 | 0 | 60 | 40 | Oxalic acid | — | — | — |
| R | 10.5 | 3,100 | — | — | — | — | 50 | 50 | Oxalic acid |

TABLE 3

| | Composition | P1 | P2 | Ratio P1:P2 | Carbon content (atom %) | Conditions of curing with ultraviolet radiation | | | | Properties of film | | | |
| | | | | | | Curing method | Temperature (° C.) | Time (min) | Oxygen partial pressure (kPa) | Relative dielectric constant | Delta k | Modulus of elasticity (GPa) | Chemical resistance | Crack resistance |
|---|---|---|---|---|---|---|---|---|---|---|---|---|---|---|
| Example 6 | I | K | M | K:M = 80:20 | 15.7 | UV light | 400 | 3 | 0.01 | 2.45 | 0.14 | 11.3 | A | A |
| Example 7 | II | K | M | K:M = 50:50 | 13.8 | UV light | 400 | 3 | 0.01 | 2.38 | 0.13 | 10.3 | A | A |
| Example 8 | III | K | M | K:M = 20:80 | 11.8 | UV light | 400 | 3 | 0.01 | 2.26 | 0.14 | 5.3 | B | A |
| Example 9 | I | L | M | L:M = 80:20 | 15.1 | UV light | 400 | 3 | 0.01 | 2.42 | 0.15 | 10.8 | B | A |
| Comparative Example 6 | K | K | — | — | 17.0 | UV light | 400 | 3 | 0.01 | 2.55 | 0.18 | 9.5 | A | B |
| Comparative Example 7 | L | L | — | — | 16.3 | UV light | 400 | 3 | 0.01 | 2.53 | 0.17 | 10.2 | A | B |
| Comparative Example 8 | M | M | — | — | 10.5 | UV light | 400 | 3 | 0.01 | 2.24 | 0.14 | 4.3 | B | A |
| Example 10 | IV | N | P | N:P = 70:30 | 15.2 | UV light | 400 | 3 | 0.01 | 2.46 | 0.13 | 10.7 | A | A |
| Example 11 | V | O | P | O:P = 70:30 | 15.0 | UV light | 400 | 3 | 0.01 | 2.44 | 0.11 | 10.5 | B | A |
| Example 12 | VII | Q | M | Q:M = 80:20 | 15.7 | UV light | 400 | 3 | 0.01 | 2.92 | 0.14 | 13.0 | A | B |
| Comparative Example 9 | N | N | — | — | 16.7 | UV light | 400 | 3 | 0.01 | 2.51 | 0.19 | 9.7 | A | B |
| Comparative Example 10 | O | O | — | — | 16.2 | UV light | 400 | 3 | 0.01 | 2.52 | 0.18 | 10.0 | A | B |
| Comparative Example 11 | P | P | — | — | 7.5 | UV light | 400 | 3 | 0.01 | 2.18 | 0.11 | 4.1 | B | A |
| Comparative Example 12 | VI | N | P | N:P = 30:70 | 10.3 | UV light | 400 | 3 | 0.01 | 2.58 | 0.14 | 11.2 | B | A |
| Reference Example 9 | I | K | M | K:M = 80:20 | 15.7 | Heat | — | — | — | 2.42 | 0.22 | 9.3 | A | B |
| Reference Example 10 | V | N | P | N:P = 70:30 | 15.2 | Heat | — | 3 | — | 2.40 | 0.21 | 9.7 | A | B |
| Reference Example 11 | I | K | M | K:M = 80:20 | 15.7 | UV light | 400 | 3 | 1.00 | 2.60 | 0.20 | 10.3 | B | A |
| Reference Example 12 | V | N | P | N:P = 70:30 | 15.2 | UV light | 400 | 3 | 1.00 | 2.56 | 0.21 | 10.1 | B | A |
| Comparative Example 13 | VIII | K | R | K:R = 80:20 | 15.7 | UV light | 400 | 3 | 0.01 | 2.65 | 0.22 | 9.1 | A | B |

4.2.2. Preparation of Organic Silica Film

The organic silica films of Examples 6 to 12, Comparative Examples 6 to 13, and Reference Examples 9 to 12 were obtained using the compositions K to R and compositions I to VIII shown in Table 2.

The film-forming compositions obtained in 4.2.1. were applied to 8 inch silicon wafers by a spin coat method, and the coatings were heated at 90° C. for one minute on a hot plate and dried at 200° C. for one minutes under a nitrogen atmosphere. The coatings were cured by applying ultraviolet radiation while heating on the hot plate to obtain organic silica film samples. The type of the compositions and the curing conditions in Examples, Reference Examples, and Comparative Examples are shown in Table 3.

White ultraviolet rays including rays with a wavelength of 250 nm or less were used as a source of ultraviolet radiation. Since the ultraviolet radiation included white ultraviolet lights, the luminance could not be measured by an effective method.

In the curing treatment of Examples 6 to 12, Comparative Examples 6 to 13, and Reference Examples 11 and 12, the coatings were cured by heating while applying ultraviolet radiation. On the other hand, in Reference Examples 9 and 10, the samples were obtained by merely heating the coatings at 420° C. for 60 minutes without applying ultraviolet radiation. In Examples 6 to 12 and Comparative Examples 6 to 13, the oxygen partial pressure was 0.01 kPa, while the oxygen partial pressure was 1 kPa in Reference Examples 11 and 12.

4.2.3. Evaluation Method

The organic silica films obtained in 4.2.2. and the condensates obtained in 4.2.1. were evaluated according to the following methods.

4.2.3-1. Relative Dielectric Constant, Delta k

An aluminum electrode pattern was formed by vapor deposition on the organic silica film formed by the method mentioned above on an N-type 8 inch silicon wafer having resistivity of 0.1 ohm·cm or less. The relative dielectric constant of the organic silica film was measured using the sample by the CV method in which an electrode "HP16451B" and a precision LCR meter "HP4284A" (both manufactured by Agilent Technologies) were used at a frequency of 100 kHz.

Delta k is the difference between the relative dielectric constant (k@RT) measured in an atmosphere of 40% RH at 24° C. and the relative dielectric constant (k@200° C.) measured in a dry nitrogen atmosphere (delta k=k@RT−k@200° C.). An increase of the relative dielectric constant due to moisture absorption mainly by the film can be evaluated by delta k. Generally, a film with a delta k of 0.15 or more is an organic silica film with high moisture absorption.

4.2.3-2. Modulus of Elasticity

The modulus of elasticity of the organic silica film formed by the above-mentioned method was measured by a continuous rigidity measuring method using a supermicro hardness meter "Nanoindentator XP" (manufactured by MTS) equipped with a Berkovich type indenter.

4.2.3-3. Chemical Resistance

An 8-inch silicon wafer on which the organic silica film was formed was dipped in a 0.2% diluted hydrofluoric acid aqueous solution for three minutes at room temperature, and the thickness change before and after dipping was inspected. If the residual film rate which is defined below was 99% or more, the film was judged to have good chemical resistance and rated as "A", otherwise the films were rated as "B".

Residual film rate (%)=(thickness after dipping)/(thickness before dipping)×100

4.2.3-4. Crack Resistance

Organic silica films with a thickness of 1 micrometer were prepared from the insulation film-forming compositions and were observed using an optical microscope (×100). A sample on which no crack was observed was evaluated to have good crack resistance and rated as "A", otherwise the sample was rated as "B".

4.2.3-5. Weight Average Molecular Weight; Mw

The weight average molecular weight of the hydrolysis-condensation product was measured by size exclusion chromatography (SEC) under the following conditions. Sample: was prepared by dissolving 0.1 g of the hydrolysis-condensation product in 100 cc of a 10 mmol/L LiBr—$H_3PO_4$ 2-methoxyethanol solution Standard sample: Polyethylene oxide manufactured by Wako Pure Chemical Industries, Ltd.

Measurement system: High performance GPC apparatus "HLC-8120" manufactured by Tosoh Corp.

Column: Three "TSK-GEL SUPER AWM-H" (15 cm in length), manufactured by Tosoh Corp., installed in series Measurement temperature: 40° C.

Flow rate: 0.6 m/min.

Detector: RI installed in a high performance GPC apparatus "HLC-8120" manufactured by Tosoh Corp.

4.2.3-6. $^{29}Si$ NMR Spectrum Measurement $^{29}Si$ NMR spectrum (100 MHz) of the condensates was measured using "BRUKER AVANCE 500".

4.2.4 Evaluation Results

The results of evaluation of the dielectric constant delta k, modulus of elasticity, chemical resistance, and crack resistance of the organic silica films obtained in Examples 6 to 12, Comparative Examples 6 to 13, and Reference Examples 9 to 12 are shown in Table 3.

The film obtained in Comparative Examples 6 and 7 showed good chemical resistance, but appeared to have poor crack resistance. On the other hand, the films obtained in Examples 6 to 9 were found to have good crack resistance. Furthermore, the films obtained in Examples 6, 7, and 9 had modulus of elasticity higher than the films obtained in Comparative Examples 6 to 8, indicating improvement of mechanical strength due to blending of the hydrolysis-condensation products P1 and P2 in the compositions. Films obtained in Examples 6 and 7 were found to exhibit crack resistance and modulus of elasticity equivalent to the film obtained in Example 9, and to have particularly good chemical resistance showing that inclusion of the component Q in the hydrolysis condensate P1 among the hydrolysis condensates to be mixed is detrimental to chemical resistance. This is also shown in the characteristics of the films obtained in Examples 10 and 11, in which the same tendency was seen. In Comparative Example 12 in which the amount of the hydrolysis-condensation product P1 was smaller than the amount of the hydrolysis-condensation product P2, the composition had a small carbon content and produced a film with poor chemical resistance. In Example 12, the condensate P1 synthesized by using an acid catalyst was used. It can be seen that, although the molecular weight of the condensate P1 used in Example 12 was smaller than the molecular weight of the condensates P1 used in Examples 6 to 11, the films produced in Examples 6 to 11 had a smaller relative dielectric constant and better crack resistance than the film obtained in Example 12. On the other hand, although the condensate P2 synthesized using an acid catalyst was used in Comparative Example 13, the resulting film showed poor crack resistance.

In Reference Examples 9 and 10, curing was carried out only using heat without using ultraviolet radiation. The films obtained in Comparative Examples 9 and 10 showed smaller modulus of elasticity and poor crack resistance as compared with the films obtained in Examples 6 and 10. Based on these results, curing by ultraviolet radiation was found to be is superior to curing with heat.

Reference Examples 11 and 12 are experiments in which an oxygen-rich atmosphere was used in curing with ultraviolet radiation. It was confirmed that the films obtained in Reference Examples 11 and 12 showed poor crack resistance as compared with the films obtained in Examples 6 and 10. The reason is considered to be the result of conversion of oxygen in the atmosphere into ozone by ultraviolet radiation, which is thought to have denatured the film into hydrophilic. These results indicate that the oxygen concentration of the atmosphere is preferably maintained at a low level during ultraviolet radiation.

As is clear from the above examples, an organic silica film with a low relative dielectric constant and low hygroscopicity, and excellent mechanical strength and etching resistance can be formed using the film-forming composition of the invention. Due to high mechanical characteristics, excellent etching resistance, a low relative dielectric constant, and low hygroscopicity, the organic silica film of the invention can be suitably used as an interlayer dielectric of semiconductor devices.

The invention claimed is:

1. An insulating-film-forming composition for a semiconductor device comprising an organic silica sol with a carbon atom content of 11 to 17 atom % and an organic solvent, the organic silica sol comprising a hydrolysis-condensation product P1 and a hydrolysis-condensation product P2, the hydrolysis-condensation product P1 being obtained by hydrolyzing and condensing (A) a silane monomer comprising a hydrolyzable group and (B) a polycarbosilane comprising a hydrolyzable group in the presence of (C) a basic catalyst, and the hydrolysis-condensation product P2 being obtained by hydrolyzing and condensing (D) a silane monomer comprising a hydrolyzable group.

2. The insulating-film-forming composition for a semiconductor device according to claim 1,
wherein the (A) silane monomer comprising a hydrolyzable group is at least one silane compound selected from the group consisting of compounds shown by the following formulas (1) to (3),

wherein R represents a hydrogen atom, a fluorine atom, or a monovalent organic group, $R^1$ represents a monovalent organic group, and a represents 1 or 2,

wherein $R^2$ represents a monovalent organic group, and

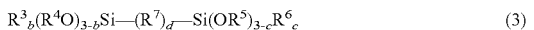

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1.

3. The insulating-film-forming composition for a semiconductor device according to claim 2,
wherein the proportion of the compound shown by the formula (2) in the (A) silane monomer comprising a hydrolyzable group is 40 mol % or less.

4. The insulating-film-forming composition for a semiconductor device according to claim 1,
wherein the (A) silane monomer comprising a hydrolyzable group is at least one compound selected from the group consisting of compounds shown by the formula (1) and compounds of the formula (3).

5. The insulating-film-forming composition for a semiconductor device according to claim 4,
wherein the (A) silane monomer comprising a hydrolyzable group is a compound shown by the formula (1).

6. The insulating-film-forming composition for a semiconductor device according to claim 5 comprising at least one compound shown by the formula (1),
wherein the proportion of the compound of the formula (1) in which a is 1 in the compounds shown by the formula (1) is 60 mass % or more.

7. The insulating-film-forming composition for a semiconductor device according to claim 4,
wherein the hydrolysis-condensation product P1 does not substantially comprises a site in which one silicon atom is substituted with four oxygen atoms.

8. The insulating-film-forming composition for a semiconductor device according to claim 1,
wherein the organic silica sol comprises the hydrolysis-condensation product P1 and the hydrolysis-condensation product P2 in a proportion satisfying the relationship of P1/(P1+P2)≧0.5 (mass ratio).

9. The insulating-film-forming composition for a semiconductor device according to claim 1,
wherein the (B) polycarbosilane comprising a hydrolyzable group has a structural unit shown by the following formula (4),

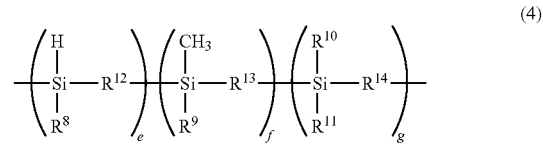

wherein $R^8$ represents a group selected from the group consisting of a hydrogen atom, a halogen atom, a hydroxyl group, an alkoxy group, an acyloxy group, a sulfone group, a methanesulfone group, a trifluoromethanesulfone group, an alkyl group, an aryl group, an allyl group, and a glycidyl group, $R^9$ represents a group selected from the group consisting of a halogen atom, a hydroxyl group, an alkoxy group, an acyloxy group, a sulfone group, a methanesulfone group, a trifluoromethanesulfone group, an alkyl group, an aryl group, an allyl group, and a glycidyl group, $R^{10}$ and $R^{11}$ individually represent a group selected from the group consisting of a halogen atom, a hydroxyl group, an alkoxy group, an acyloxy group, a sulfone group, a methanesulfone group, a trifluoromethanesulfone group, an alkyl group having 2 to 6 carbon atoms, an aryl group, an allyl group, and a glycidyl group, $R^{12}$ to $R^{14}$ individually represent a substituted or unsubstituted methylene group, an alkylene group, an alkenylene group, an alkynylene group, or an arylene group, and e, f, and g individually represent an integer from 0 to 10,000, provided that 5<e+f+g<10,000 is satisfied.

10. The insulating-film-forming composition for a semiconductor device according to claim 1,
wherein the (D) silane monomer comprising a hydrolyzable group is at least one compound selected from the group consisting of the compound shown by the following formula (5), the compound shown by the following formula (6), the compound shown by the following formula (7), and the compound shown by the following formula (8), $$R^{15}Si(OR^{16})_3 \quad (5)$$

wherein $R^{15}$ and $R^{16}$ individually represent an alkyl group or an aryl group, $$Si(OR^{17})_4 \quad (6)$$

wherein $R^{17}$ represents an alkyl group or an aryl group, $$(R^{18})_2Si(OR^{19})_2 \quad (7)$$

wherein $R^{18}$ represents an alkyl group or an aryl group, and $R^{19}$ represents an alkyl group or an aryl group, and $$R^{21}{}_b(R^{22}O)_{3-b}Si-(R^{25})_d-Si(OR^{23})_{3-c}R^{24}{}_c \quad (8)$$

wherein $R^{21}$ to $R^{24}$ individually represent an alkyl group or an aryl group, b and c individually represent an integer from 0 to 2, $R^{25}$ represents an oxygen atom, a phenylene group, or a group $-(CH_2)_m-$ (wherein m represents an integer from 1 to 6), and d represents 0 or 1.

11. The insulating-film-forming composition for a semiconductor device according to claim 10,
wherein the (D) silane monomer comprising a hydrolyzable group comprises 10 to 60 mol % of the compound shown by the formula (5) and 40 to 90 mol % of the compound shown by the formula (6).

12. The insulating-film-forming composition for a semiconductor device according to claim 1,
wherein the weight average molecular weight of the hydrolysis-condensation product P2 is larger than the weight average molecular weight of the hydrolysis-condensation product P1.

13. The insulating-film-forming composition for a semiconductor device according to claim 1 not comprising a reaction accelerator responsive to ultraviolet radiation.

14. The insulating-film-forming composition for a semiconductor device according to claim 13,
wherein the reaction accelerator is one of, or a combination of two or more of, a reaction initiator, an acid generator, a base generator, and a photosensitizer having a ultraviolet absorption function.

15. A method for producing the insulating-film-forming composition for a semiconductor device according to claim 1 comprising:
hydrolyzing and condensing (A) a silane monomer comprising a hydrolyzable group and (B) a polycarbosilane comprising a hydrolyzable group in the presence of (C) a basic catalyst to form a hydrolysis-condensation product P1 and hydrolyzing and
condensing (D) a silane monomer comprising a hydrolyzable group to form the hydrolysis-condensation product P2.

16. A method for forming an organic silica film comprising applying the insulating-film-forming composition for a semiconductor device according to claim 1 to a substrate to form a coating, heating the coating, and irradiating the coating with ultraviolet rays to cure the coating.

17. The method for forming an organic silica film according to claim 16,
wherein the ultraviolet radiation has a wavelength of 250 nm or less.

18. The method for forming an organic silica film according to claim 16,
wherein the coating is heated while applying the ultraviolet radiation.

19. The method for forming an organic silica film according to claim 16,
wherein the coating is heated at 300 to 450° C.

20. The method for forming an organic silica film according to claim 16,
wherein the ultraviolet radiation is applied in the absence of oxygen.

21. An organic silica film obtained by the method for forming an organic silica film according to claim 16 and having a relative dielectric constant of 1.5 to 3.5 and a film density of 0.7 to 1.3 g/cm3.

22. A wiring structure comprising the organic silica film according to claim 21 as an interlayer dielectric.

23. A semiconductor device comprising the wiring structure according to claim 22.

* * * * *